(12) United States Patent
Takemura et al.

(10) Patent No.: US 7,257,034 B2
(45) Date of Patent: Aug. 14, 2007

(54) SEMICONDUCTOR INTEGRATED CIRCUIT DEVICE

(75) Inventors: Riichiro Takemura, Tokyo (JP); Takeshi Sakata, Hino (JP); Norikatsu Takaura, Tokyo (JP); Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/598,702

(22) Filed: Nov. 14, 2006

(65) Prior Publication Data

US 2007/0070716 A1    Mar. 29, 2007

Related U.S. Application Data

(63) Continuation of application No. 10/995,198, filed on Nov. 24, 2004, now Pat. No. 7,154,788.

(30) Foreign Application Priority Data

Nov. 28, 2003 (JP) ............................ P2003-398398

(51) Int. Cl.
*G11C 11/34* (2006.01)
(52) U.S. Cl. .................................. 365/189.05; 365/196
(58) Field of Classification Search .......... 365/189.05, 365/196
See application file for complete search history.

(56) References Cited

U.S. PATENT DOCUMENTS

| 4,918,658 | A | * | 4/1990 | Shah et al. ................. 365/227 |
|---|---|---|---|---|
| 5,293,347 | A | * | 3/1994 | Ogawa ................... 365/230.01 |
| 5,406,525 | A | | 4/1995 | Nicholes ................. 365/230.02 |
| 5,717,625 | A | | 2/1998 | Hasegawa et al. ............ 365/49 |
| 6,654,290 | B2 | | 11/2003 | Lee et al. ............... 365/185.23 |
| 2006/0092746 | A1 | * | 5/2006 | Nii .............................. 365/227 |
| 2006/0187721 | A1 | * | 8/2006 | Freebern ..................... 365/193 |
| 2006/0262628 | A1 | * | 11/2006 | Nii et al. .................... 365/226 |
| 2007/0019457 | A1 | * | 1/2007 | Sato et al. ..................... 365/63 |

OTHER PUBLICATIONS

M. Gill et al., "Ovonic Unified Memory—A High-Performance Nonvolatile Memory Technology for Stand-Alone Memory and Embedded Applications", IEEE International Solid-State Circuits Conference Digest of Technical Papers, 2002, pp. 202-203.

(Continued)

*Primary Examiner*—Michael Tran
(74) *Attorney, Agent, or Firm*—Miles & Stockbridge P.C.

(57) ABSTRACT

There is achieved a high-integrated and high-speed nonvolatile memory which can stabilize an operation of a phase-change memory for a short operation cycle time. A latch is provided in a write driver. A change to a high-resistance state of a phase-change element is performed per column cycle by a write-enable signal, and a change to a low-resistance state thereof is performed after a pre-charge command is inputted and concurrently with deactivation of a pre-charge signal. Thereby, a write time to a memory cell in which phase-change resistance is changed to a low-resistance state, and a period from a write operation for changing the phase-change resistance to a high-resistance state to a read operation to the above memory cell can be lengthened without extending the column cycle time, so that the stable write operation is achieved.

6 Claims, 22 Drawing Sheets

OTHER PUBLICATIONS

A. Pirovano et al., "Electronic Switching Effect in Phase-Change Memory Cells", IEEE International Electron Devices Meeting, Technical Digest, 2002, pp. 923-926.

Y. Hwang et al., "Completely CMOS-Compatible Phase-Change Nonvolatile RAM using NMOS Cell Transistors", Nonvolatile Semiconductor Memory Workshop, Digest of Technical Papers, 2003, pp. 91-92.

* cited by examiner

SEMICONDUCTOR INTEGRATED CIRCUIT DEVICE

This application is a continuation of application Ser. No. 10/995,198 filed Nov. 24, 2004 now U.S. Pat. No. 7,154,788.

CROSS-REFERENCE TO RELATED APPLICATION

The present application claims priority from Japanese patent application No. JP 2003-398398 filed on Nov. 28, 2003, the content of which is hereby incorporated by reference into this application.

BACKGROUND OF THE INVENTION

The present invention relates to a technique for writing data in a semiconductor integrated circuit device and especially a technique effectively applicable to stabilization of data write in a semiconductor memory, which utilizes a phase-change resistance.

Development of a phase-change memory is advanced in order to achieve a high-speed and high-integrated nonvolatile memory.

In the phase-change memory, a phase-change material called a chalcogenide material stores data by utilizing a resistance property depending on its states.

Rewriting of the phase-change resistance is performed by changing its state by applying a current thereto and generating heat. A change to a low-resistance state, which is called also a set operation, reads out the phase-change material by maintaining relatively low temperature for a sufficient period, and the above operation is performed by carrying the current within such a range that the phase-change resistance is not changed (see Non-patent Document 1: 2002 IEEE International Solid-State Circuits Conference, Digest of Technical Papers, pp. 202-203).

Also, characteristics of the phase-change resistance are described in IEEE, International Electron Devices Meeting, Technical Digest (see Non-patent Document 2: 2002 IEEE International Electron Devices Meeting, Technical Digest, pp. 923-926).

Further, a memory cell, constituted by the phase-change resistance and an N-channel MOS (Metal Oxide Semiconductor) transistor, is described in Nonvolatile Semiconductor Memory Workshop, Digest of Technical Papers (see Non-patent Document 3: 2003 Non-volatile Semiconductor Memory Workshop, Digest of Technical Papers, pp. 91-92).

Not only a high-speed ROM (Read Only Memory) but also a feasibility of nonvolatile RAM (Random Access Memory) is described in the above-mentioned Documents, and then a feasibility of an integrated memory having functions of ROM and RAM in combination is mentioned therein.

FeRAM (ferroelectric RAM) and MRAM (Magnetic RAM) as similar high-speed nonvolatile memories are also developed. In the FeRAM, it is difficult to reduce an area of a ferroelectric capacitor and reduce an area of a cell. In the MRAM, since a rate of change of its magnetic resistance is small, an amount of signals to be read out is small and it is difficult to perform a high-speed reading operation.

Meanwhile, in the phase-change memory, if an area of an electrode having the phase-change resistance is smaller, the phase-change resistance can be phase-changed with low power, so that scaling is easy to perform. Also, the phase-change resistance is changed larger than the magnetic resistance of the MRAM, so that high-speed read-out is can be achieved. For these reasons, the high-speed nonvolatile memory by the phase-change memory is expected to be achieved.

SUMMARY OF THE INVENTION

The present inventors have found that the above-described phase-change memory has the following problem.

That is, in the phase-change memory, there is the problem of ensuring a write time. As described above, in the phase-change memory, a phase change generated by Joule heat is utilized for storing data. In order to make the resistance low, it is necessary to continuously apply the current to the phase-change resistance for a relatively long time, e.g. about 20 ns. Further, immediately after a change to a high-resistance state has been made, it is necessary to wait for a sufficiently long time in which a change is made from a high-temperature state to a steady state, e.g. for about 20 ns.

Meanwhile, in a spec of SDRAM (Synchronous Dynamic RAM), an operation is required to be performed at 10 ns or less for read and write cycles. Thus, there is the problem that drawbacks on the operation of the phase-change memory cannot be solved only by substituting a general DRAM memory cell with a memory cell array employing the phase-change resistance.

The object of the present invention is to provide a technique, which can stabilize the operation of the phase-change memory for a short operation cycle time and achieve a high-integrated and high-speed nonvolatile memory.

Another object of the present invention is to provide a technique, which can prevent a decrease of data reliability, which is caused by a change in characteristics of phase-change elements when the high-speed operation is achieved.

The above and other objects, features and advantages of the present invention will become apparent from the description of the specification and the accompanying drawings.

Outlines of representative ones of inventions disclosed in the present application will be briefly described as follows.

A semiconductor integrated circuit device according to the present invention comprises: a plurality of word lines; a plurality of bit lines intersecting with said plurality of word lines; a number of memory cells disposed at desirable intersections between said plurality of word lines and said plurality of bit lines; a sense amplifier connected to each of said plurality of bit lines; and a first write driver connected to said sense amplifier and writing first information to said memory cells connected respectively to said plurality of bit lines, wherein a plurality of said first write drivers are activated per data input cycle to the sense amplifier.

Also, outlines of other inventions disclosed in the present application will be briefly described as follows.

A semiconductor integrated circuit device according to the present invention comprises: a plurality of first word lines; a plurality of first bit lines intersecting with said plurality of first word lines; and a memory cell array including a number of first memory cells disposed at desirable intersections between said plurality of first word lines and said plurality of first bit lines, wherein said memory cell array includes a number of second memory cells disposed at desirable intersections between a second word line arranged in parallel with said first word lines and said plurality of first bit lines, and said second memory cells temporarily store data for said first memory cells on the first word lines.

Further, a semiconductor integrated circuit device according to the present invention comprises: a plurality of first word lines; a plurality of first bit lines intersecting with said plurality of first word lines; and a memory cell array including a number of first memory cells disposed at desirable intersections between said plurality of first word lines and said plurality of first bit lines, wherein said memory cell array includes: a second bit line arranged in parallel with said first bit lines; and a number of second memory cells disposed at desirable intersections between said plurality of first word lines and said second bit line, in which first check bit data generated from the data for said plurality of first memory cells is written into said second memory cells.

Effects obtained from representative ones of inventions disclosed in the present application will be briefly described as follows.

In the semiconductor integrated circuit device that uses a phase-change element as a memory cell, while a stable write operation is implemented, a spec which is nearly equal to the existing SDRAM can be achieved.

DESCRIPTION OF THE PREFERRED EMBODIMENTS

Figure 1:
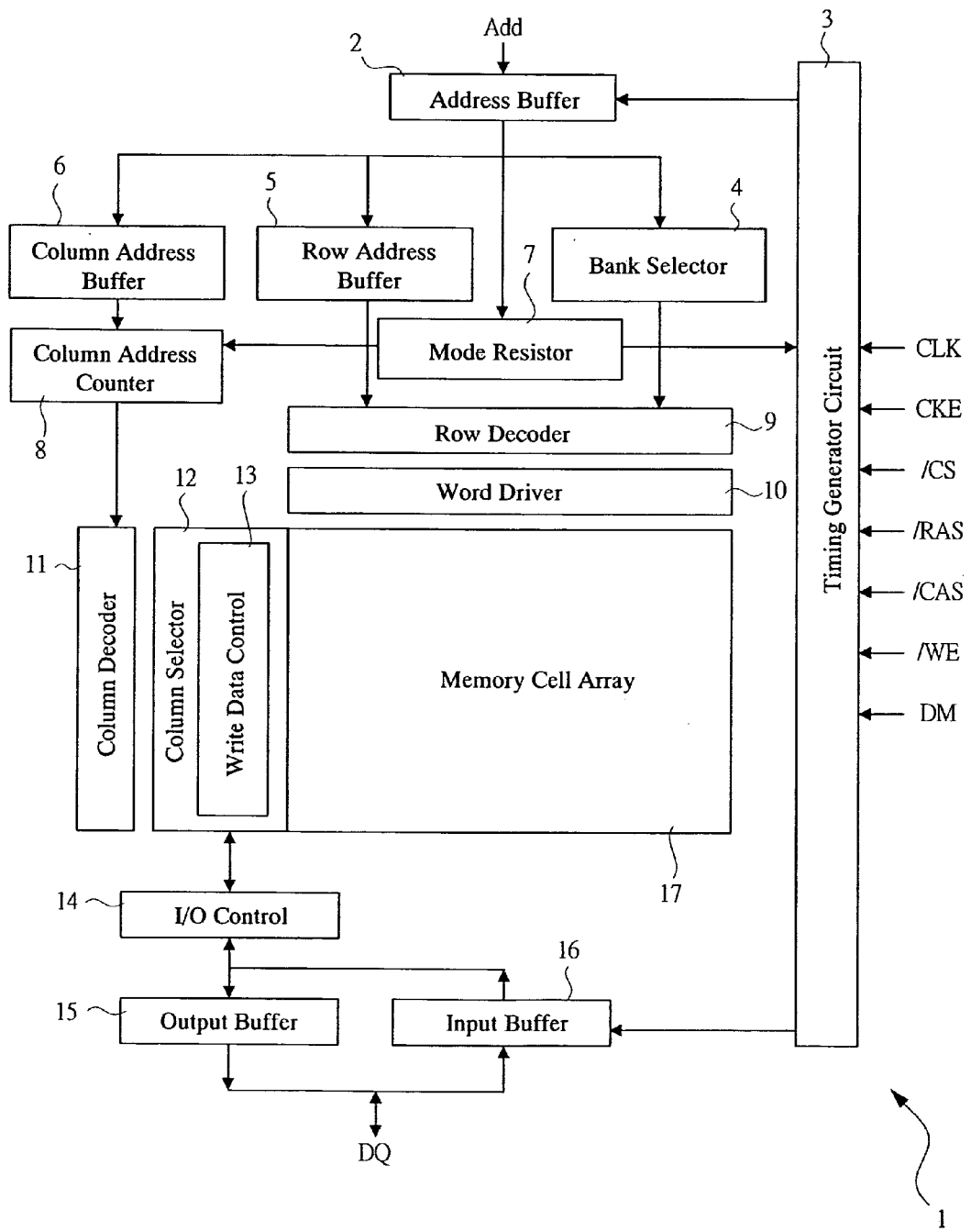
FIG. 1 is a block diagram of a nonvolatile memory according to a first embodiment of the present invention.

Hereinafter, embodiments of the present invention will be detailed based on the drawings. Note that the same members are denoted in principle by the same reference numeral throughout all the drawings for explaining the embodiments and the repetitive description thereof will be omitted.

Also, in all the drawings for describing the embodiments, although circuit elements constituting each function block are not particularly limited, they are formed on/over a semiconductor substrate such as single crystal silicon by an integrated circuit technique such as a well-known CMOS (complementary MOS) transistor. A P-channel MOS transistor is distinguished from an N-channel MOS transistor in the drawings by marking an arrow on a body thereof. In the drawings, although connection of a substrate potential of the MOS transistor is not particularly specified, a method of the connection is not particularly limited as long as the MOS transistor can be normally operated. Also, a low level of a signal will be set to "0" and a high level thereof will be set to "1" unless otherwise noted.

First Embodiment

Figure 2:
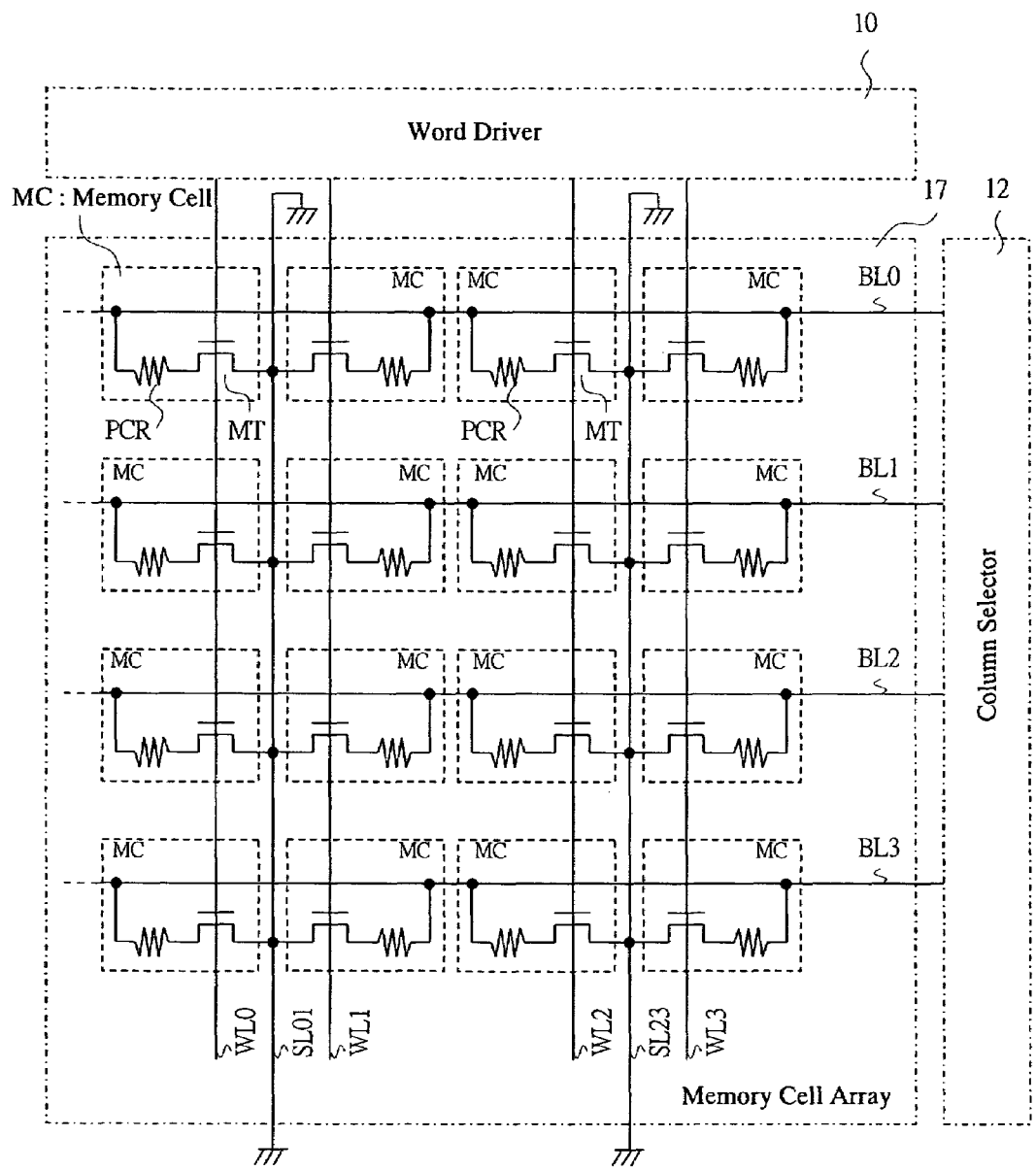
FIG. 2 is a circuit diagram showing a configuration example of a memory cell array provided in the nonvolatile memory in FIG. 1.
Figure 4:
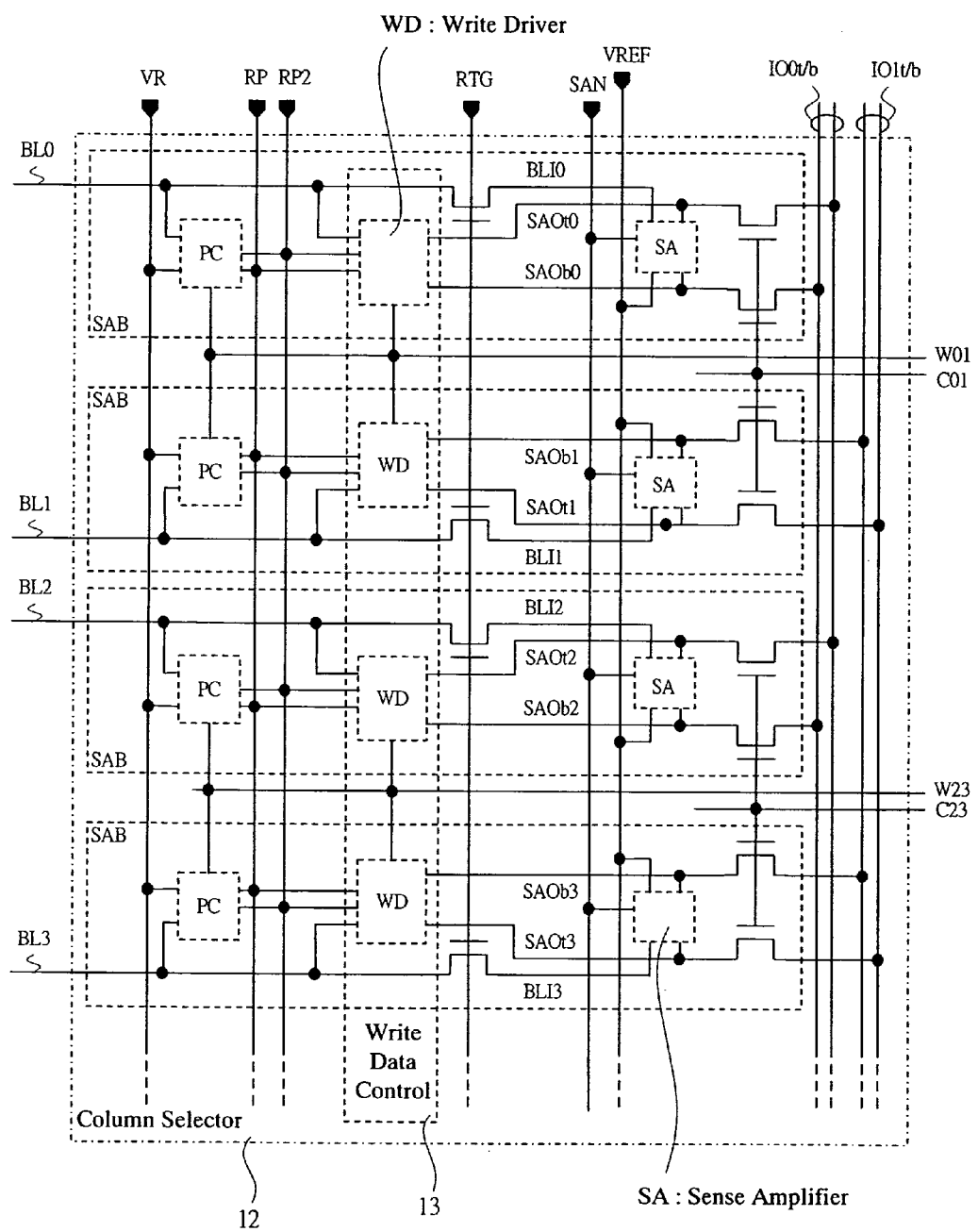
FIG. 4 is a circuit diagram of a column selector provided in the nonvolatile memory in FIG. 1.
Figure 5:
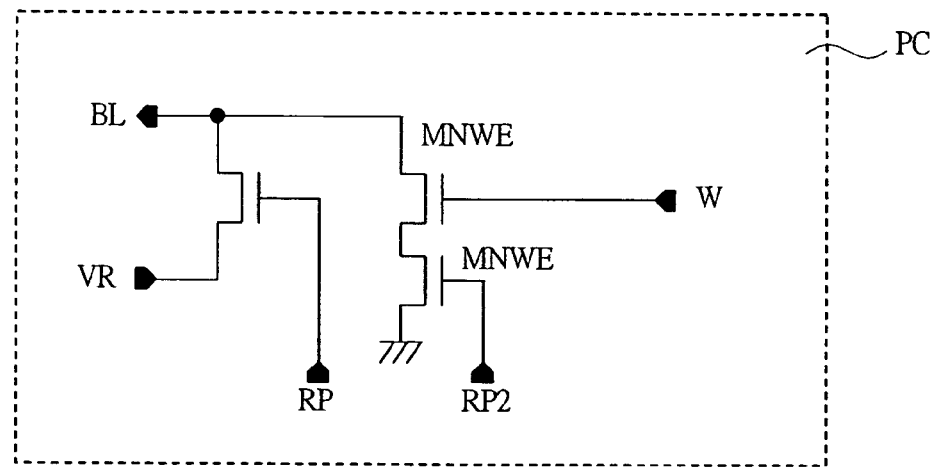
FIG. 5 is a circuit diagram showing one example of a pre-charge circuit provided in the column selector in FIG. 4.
Figure 6:
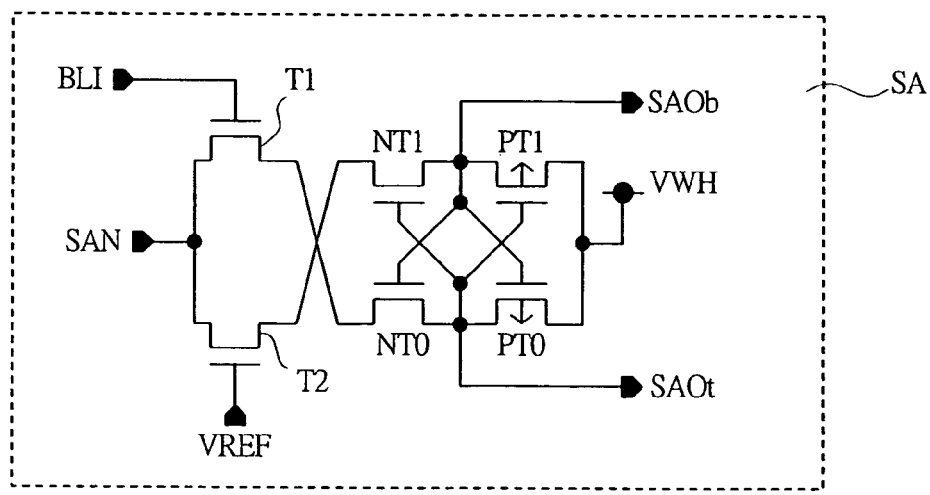
FIG. 6 is a circuit diagram showing one example of a sense amplifier provided in the column selector in FIG. 4.
Figure 7:
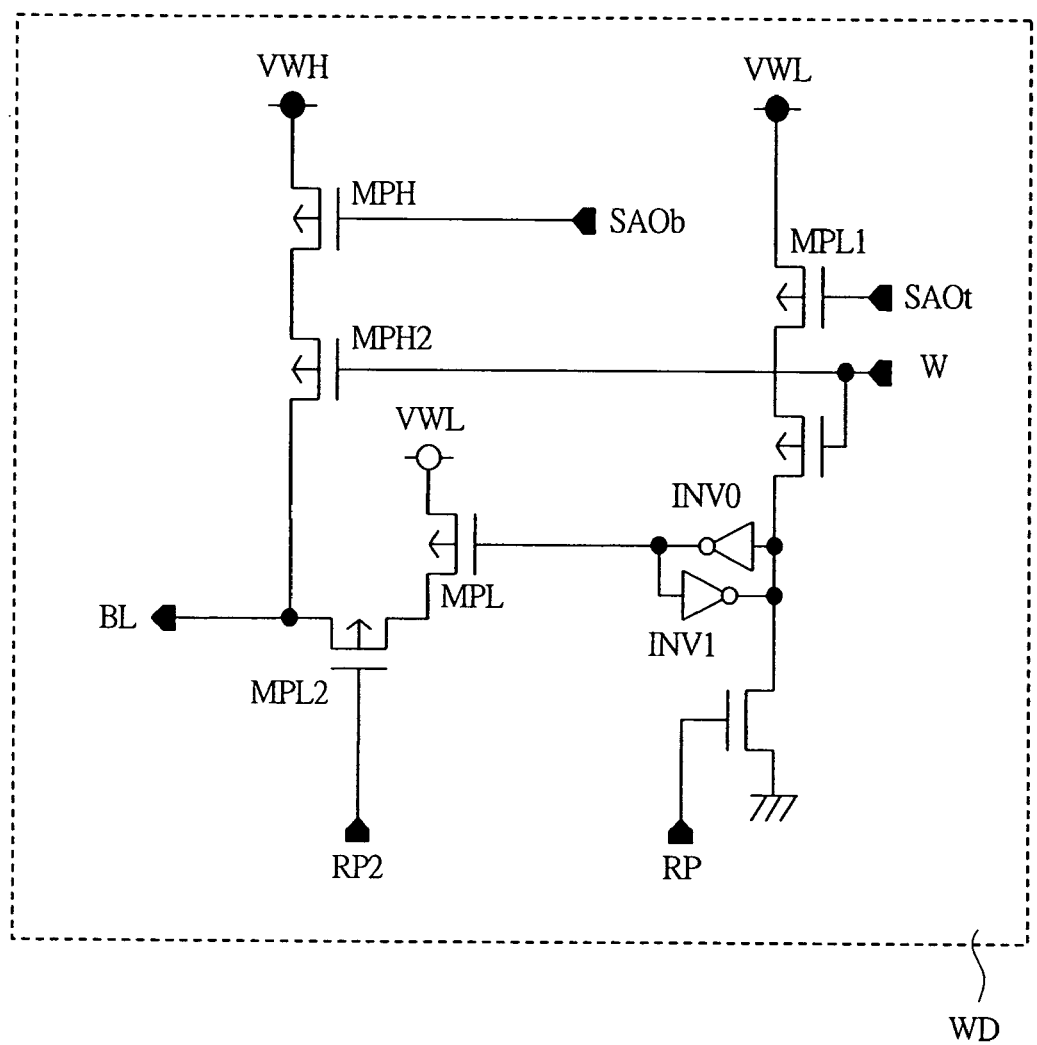
FIG. 7 is a circuit diagram showing one example of a write driver provided in the column selector in FIG. 4.
Figure 8:
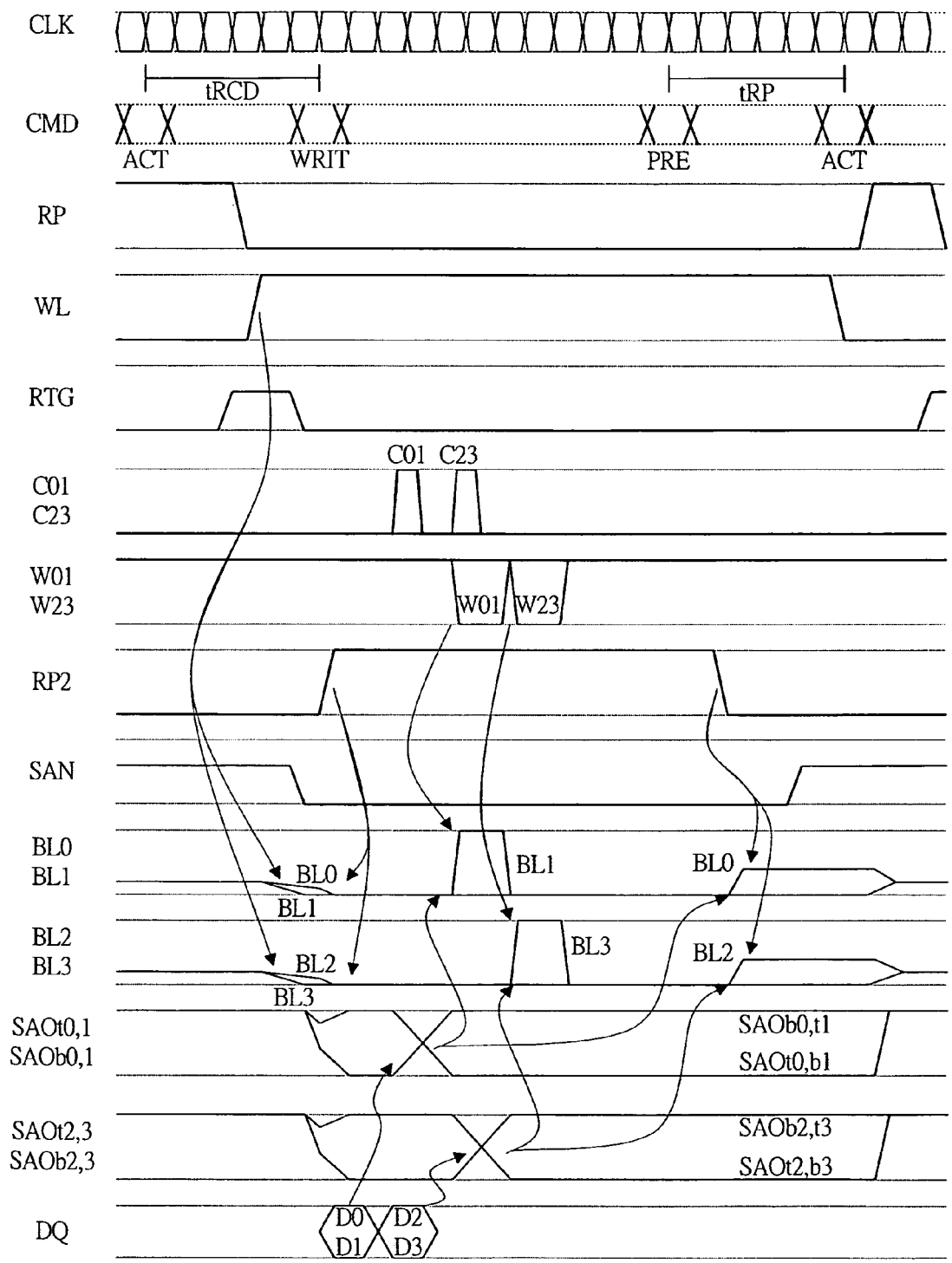
FIG. 8 is a timing chart of a write operation in the nonvolatile memory in FIG. 1.
Figure 9:
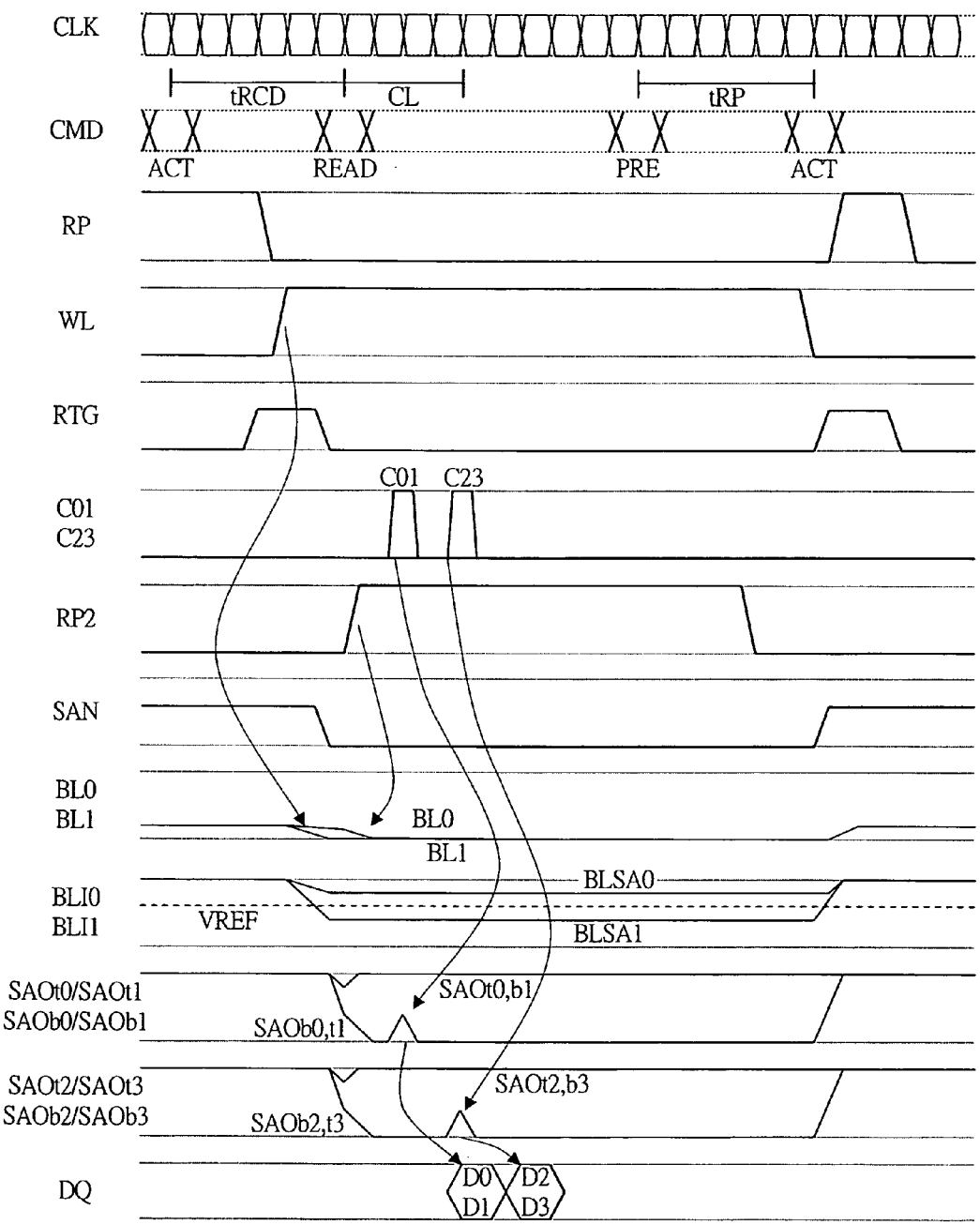
FIG. 9 is a timing chart of a read operation in the nonvolatile memory in FIG. 1.
Figure 10:
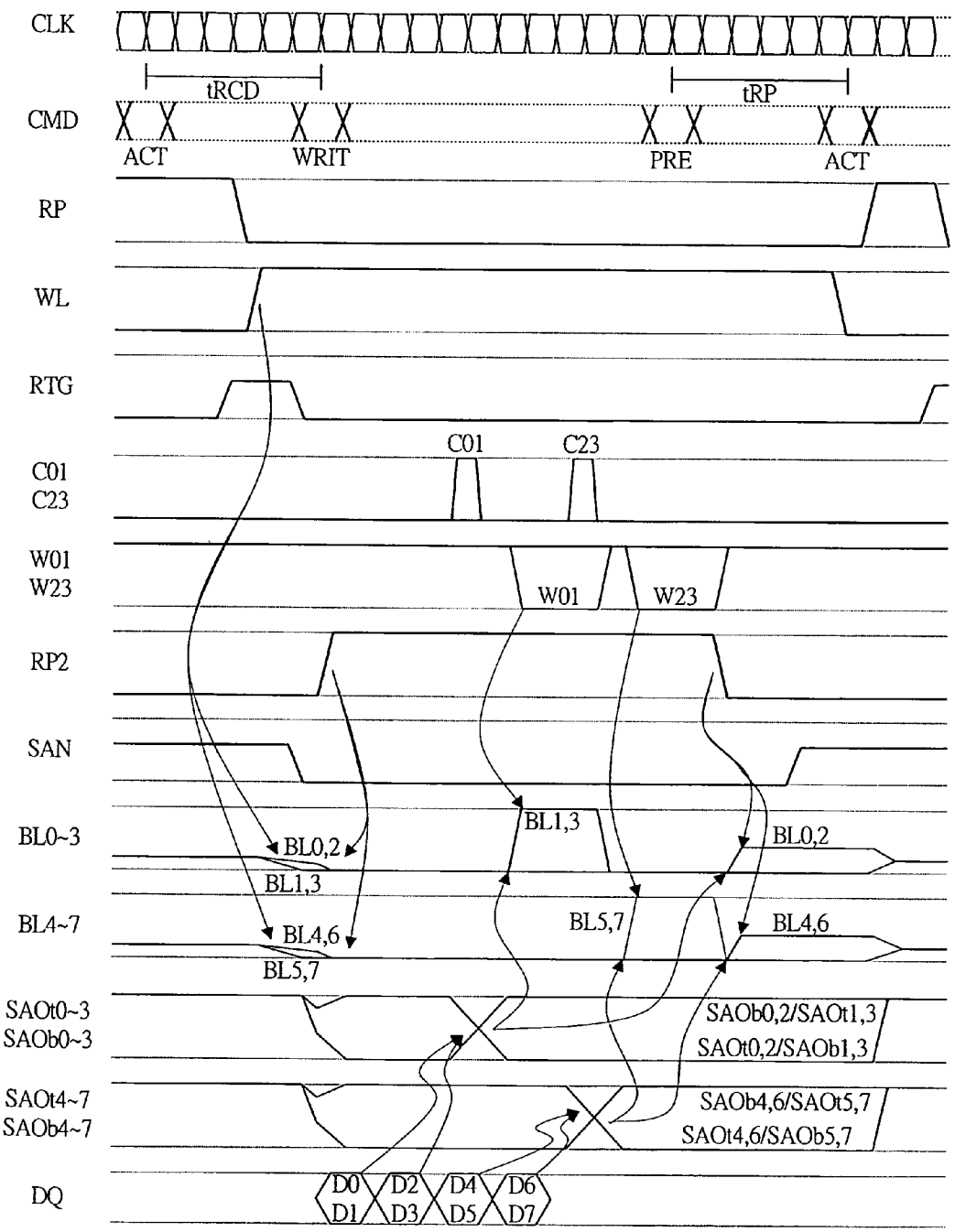
FIG. 10 is a timing chart showing another example of a write operation in the nonvolatile memory in FIG. 1.
Figure 11:
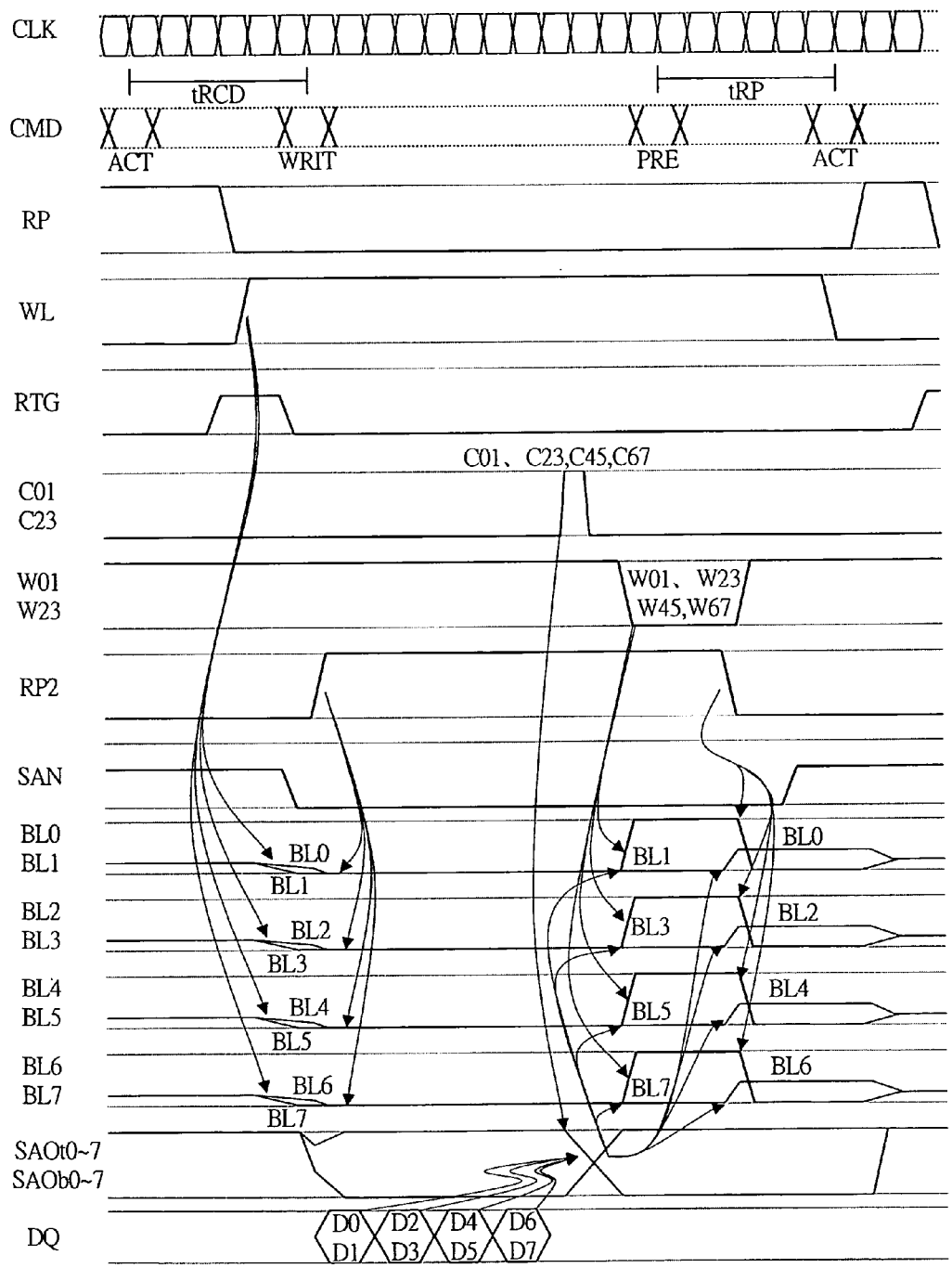
FIG. 11 is a timing chart showing another example of a read operation in the nonvolatile memory in FIG. 1.

FIG. 1 is a block diagram of a nonvolatile memory according to a first embodiment of the present invention; FIG. 2 is a circuit diagram showing a configuration example of a memory cell array provided in the nonvolatile memory in FIG. 1; FIG. 3 is a block diagram of a memory cell provided in the memory cell array in FIG. 2; FIG. 4 is a circuit diagram of a column selector provided in the nonvolatile memory in FIG. 1; FIG. 5 is a circuit diagram showing one example of a pre-charge circuit provided in the column selector in FIG. 4; FIG. 6 is a circuit diagram showing one example of a sense amplifier provided in the column selector in FIG. 4; FIG. 7 is a circuit diagram showing one example of a write driver provided in the column selector in FIG. 4; FIG. 8 is a timing chart of a write operation in the nonvolatile memory in FIG. 1; FIG. 9 is a timing chart of a read operation in the nonvolatile memory in FIG. 1; FIG. 10 is a timing chart showing another example of a write operation in the nonvolatile memory in FIG. 1; and FIG. 11 is a timing chart showing another example of a read operation in the nonvolatile memory in FIG. 1.

A nonvolatile memory 1 (semiconductor integrated circuit device) of the present embodiment is a memory having a SDRAM interface which uses a phase-charge element as a memory cell.

The nonvolatile memory 1 includes a write data controller 13 for controlling a write voltage, a write time, and write timing in a column selector 12. The nonvolatile memory 1 has features in which a change to a high-resistance state is made per column cycle and a change of a low-resistance state is made after a pre-charge command is inputted.

As shown in FIG. 1, the nonvolatile memory 1 is configured by an address buffer 2, a timing generator circuit 3, a bank selector 4, a row address buffer 5, a column address buffer 6, a mode register 7, a column address counter 8, a row decoder 9, a word driver 10, a column decoder 11, a column selector 12, a write data control 13, an I/O (Input/Output) control 14, an output buffer 15, an input buffer 16, and a memory cell array 17. A defect relief circuit and an internal power source generator circuit, etc. are omitted in order to simplify FIG. 1.

The address buffer 2 temporarily stores an address inputted from the outside. The timing generator circuit 3 transmits a control signal over the entirety of a chip in accordance with a command inputted to a command pin and a part of an address pin from the outside. The bank selector 4 selects a specific bank in accordance with an inputted address Add.

The row address buffer 5 temporarily stores the address Add inputted as an X address. The column address buffer 6 temporarily stores the address Add inputted as a Y address.

The mode resistor 7 controls a read/write burst operation at a column access. The column address counter 8 internally generates an address to be made at a time of the burst operation. The row decoder 9 generates selection signals for selecting a sub array and a word line in accordance with the inputted X address, and controls a circuit block such as a sense amplifier in accordance with those signals.

The word driver 10 selects a specific word line in accordance with the selection signal outputted from the row decoder 9. The column decoder 11 outputs a signal for selecting input/output data, and a signal for controlling a write operation in accordance with the inputted Y address.

The column selector 12 selects data to be outputted outside the memory cell array 17 in accordance with the selection signal outputted from the column decoder 11. The write data control 13 is disposed in the column selector 12 and writes data inputted from the outside, into the memory cell array 17, in accordance with the write data in the column selector 12.

The I/O control 14 controls order in which the data outputted from the memory cell 17 is outputted outside the chip, and an operation in which the data inputted from outside the chip is written to the memory cell array. The output buffer 15 outputs, outside the chip, the data transmitted from the I/O control 14.

The input buffer 16 temporarily stores data inputted from the outside, and transmits the data to be written into the memory cell array 17 to the I/O control 14 by controlling the timing generator circuit 3. In the memory cell array 17, memory cells MC for storing data are disposed in the form of an array.

FIG. 2 is view showing a configuration example of the memory cell array 17.

The memory cell array 17 is configured by word lines WL0, WL1, WL2, WL3, ..., connected to the word driver 10, bit lines BL0, BL1, BL2, BL3, ..., and memory cells MC disposed at desirable intersections of both lines.

Further, in the memory cell array 17, source lines SL01, SL23, ..., are provided and connected to a control line controlled at a read time, a write time, and a standby time, or to a specific potential such as ground level (reference potential) VSS. A configuration of this embodiment can be simplified by providing the source lines on a plate to be used in common in the memory cell array 17. In this case, the bit line is sometimes called a data line.

Figure 3A:
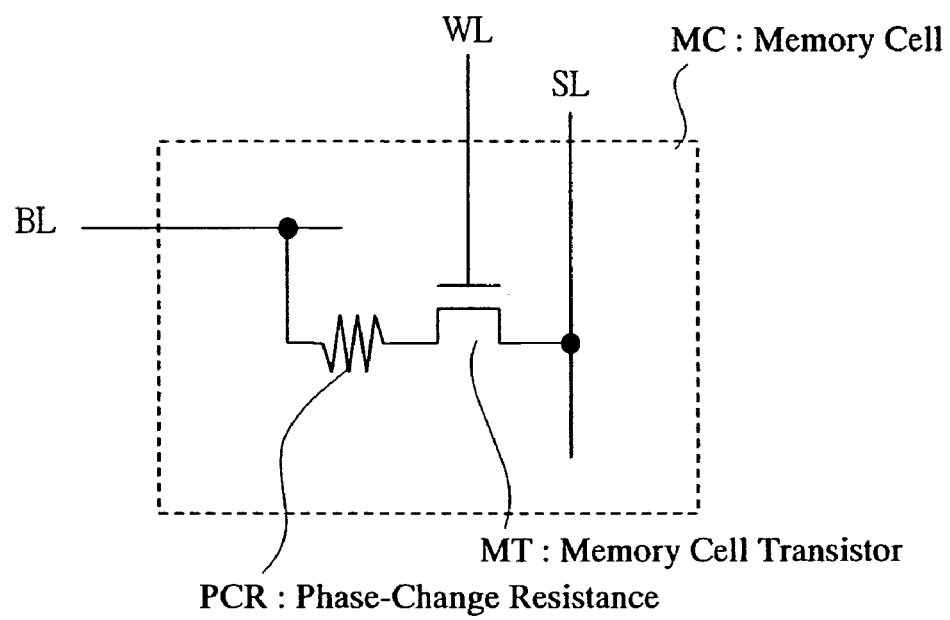
FIG. 3A is a block diagram of a memory cell provided on the memory cell array in FIG. 2.

As shown in FIG. 3A, each memory cell comprises phase-change resistance PCR and a memory cell transistor MT. One end of the phase-change resistance PCR is connected to the bit line and the other end thereof is connected to one junction of the memory cell transistor MT.

The phase-change resistance PCR consists of, for example, a chalcogenide material containing germanium, antimony, and tellurium, etc. The other junction of the memory cell transistor MT is connected to the source line, and a gate of the memory cell transistor MT is connected to the word line.

Figure 3B:
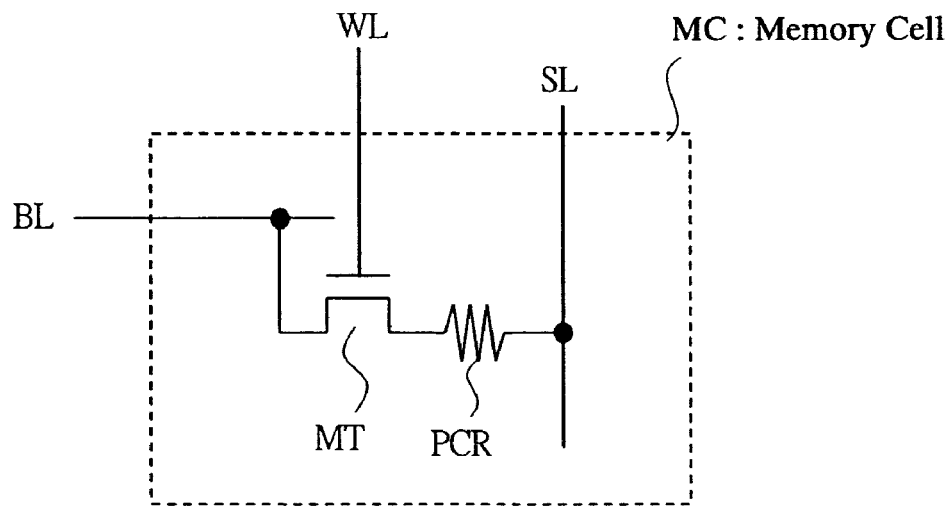
FIG. 3B is a block diagram of a memory cell provided on the memory cell array in FIG. 2.

As shown in FIG. 3B, the phase-change resistance PCR and the memory cell transistor MT in FIG. 3A may be replaced with each other, as an inside structure of the memory cell MC.

In such a replaced configuration, there is the advantage that even if the bit line is driven by the write operation etc., an alternating current (AC) can be prevented from flowing to the phase-change resistance from the bit line by maintaining the word line in an unselected state. Further, there is the advantage that since capacity of diffusion layer can be observed from the bit line BL without interposing the phase-change elements, there is no dependency of a data pattern.

A dummy cell for generating a reference signal at a time of a write operation is also provided as occasion demands although it is not shown for simplifying the Figure. Further, although the N-channel MOS transistor is shown as a memory cell transistor, a P-channel MOS transistor or/and a bipolar transistor may be used. However, the MOS transistor is appropriate from the viewpoint of achieving high integration, and the N-channel MOS transistor which has less channel resistance in on-state than that of the P-channel MOS transistor is preferable.

FIG. 4 is a circuit diagram showing one example of the column selector 12. A portion of the column selector 12 is shown in FIG. 4.

The column selector 12 includes: sense amplifier blocks SAB connected respectively to the bit lines BL0, BL1, BL2, ...; and write data control 13 disposed across the respective sense amplifier blocks SAB.

The sense amplifier block SAB is constituted by: a pre-charge circuit PC for setting the bit line to a desired level for a desired period; a write driver (first write driver, second write driver, and second data retaining circuit) WD, which is included in the write data control 13 and drives the bit lines BL0, BL1, BL2, ... in order to write the data to the memory cell MC in accordance with the write data; and a sense amplifier (first data retaining circuit) SA for amplifying a small signal outputted from the memory cell MC.

FIG. 5 is a circuit showing a configuration example of a pre-charge circuit PC in a sense amplifier block SAB.

The pre-charge circuit PC sets the bit line BL to a pre-charge level VR in a standby state by a pre-charge signal RP outputted from the row decoder 9, and alternatively sets it to the same potential as that of the source line in the memory cell (ground level VSS in FIG. 5), in active-standby state except for the read and write periods in an active state, by an active-standby pre-charge signal RP2 outputted from the row decoder 9 and a write-enable signal W outputted from the column decoder 11.

The write drivers WD disposed in the write data control 13 are disposed per sense amplifier block SAB and apply, to the bit lines, a voltage required for being written into the memory cell MC in accordance with the write data.

FIG. 6 is a circuit diagram showing a configuration example of the sense amplifier SA.

In FIG. 6, although the a bit line BLI in the sense amplifier SA and a pre-charge circuit for output nodes SAOt/SAOb are omitted, a switch for setting to a desirable level at a standby is connected to them.

In the sense amplifier SA, a transistor T1 whose gate receives the bit line BLI within the sense amplifier SA and a transistor T2 whose gate receives a reference level VREF are made a pair and are inputted to sources of the N-channel MOS transistors NT0 and NT1, respectively.

P-channel MOS transistors PT0 and PT1 and the N-channel MOS transistors NT0 and NT1 constitute a cross-couple type amplifier. Each drain side of the transistors NT1 and PT1 is connected to the output node SAOb.

Further, each drain side of the transistors NT0 and PT0 is connected to the output node SAOt, and if a sense-amplifier source node SAN is driven to the ground level VSS, a small signal between the bit line BLI and the reference level VREF is amplified through a cross coupling, so that a signal with an array operation voltage amplitude are outputted to the output nodes SAOt/b.

The circuit configurations of the pre-charge circuit PC, the write driver WD, and the sense amplifier SA are not limited to the above configurations, and if other circuit configurations have the same functions as those of the above configurations, they may be applied.

For example, although the reference level VREF is common to a plurality of sense amplifiers in this configuration, each reference level may be individually generated by using different dummy cells.

FIG. 7 is a circuit diagram showing one example of the write driver WD.

A P-channel MOS transistor MPH is turned on when the sense-amplifier output node SAOb is "0", and supplies a high-resistance voltage VWH to the bit line BL when the P-channel MOS transistor MPH2 becomes activated by the write-enable signal W.

Also, in the P-channel MOS transistor MPL1, its gate level is set to the ground level VSS by the write-enable signal W when the sense-amplifier output node SAOt is "0", and a low-resistance voltage VWL is supplied to the bit line BL when a P-channel MOS transistor MPL2 is activated by an active standby pre-charge signal RP2.

Two inverters INV0 and INV1 configure a latch, thereby latching the data of the sense-amplifier output node SAOb at a time of occurrence of a write selection and setting the gate level of the P-channel MOS transistor MPL used for supplying a voltage required for a change to a low-resistance state voltage in accordance with the data of the sense-amplifier output node SAOb. The latch is initialized by the pre-charge signal RP. The circuit configuration of the write driver WD is not limited to the above configuration, and if other circuit configuration has the same functions as those of the above configuration, it may be applied.

Next, an operation of the nonvolatile memory 1 according to the first embodiment will be described.

An internal operation of the nonvolatile memory 1 is determined by combination of the address Add and the signal inputted into the command input pin. The address is normally inputted separately into a row address and a column address in the SDRAM.

Firstly, an activate command is inputted together a bank address and a raw address. The bank address is transmitted to the bank selector 4 and activates a specific bank in the chip. The address to be simultaneously inputted is transmitted from the address buffer 2 to the row address buffer 5 and the low decoder 9, and generates a selection signal for selecting a specific word line.

Then, the word line corresponding to the inputted address is selected in the word driver 10. When the word line is selected, the data for the memory cell MC is read by the sense amplifier SA in-the column selector 12.

After the row address is inputted and a longer period of time than a spec-specified period lapses, the column address together with a command such as read/write is inputted into the address buffer 2. The inputted address is transmitted from the address buffer 2 to the column address buffer 6, and the column decoder 11 outputs a column-selection line for selecting the sense amplifier which has the specific address.

In the column operation, plural-time data input/output operations are sometimes performed with respect to one-time address input operation. Therefore, addresses are sequentially generated from the initial input address in order prescribed by the mode resistor 7 in the column address counter 8, and the generated addresses are transmitted to the column decoder 11.

When the column address together with the read command is inputted, the data for the sense amplifier SA which has the address selected by the column-selection line outputted from the column decoder 11 is transmitted from the column selector 12 to the I/O control 14. In this case, the output data is selected and the selected data is outputted from the output buffer 15 to the input/output pin DQ.

When the column address together with the write command is inputted, the data is inputted into the input/output pin DQ at the same time that the command address is inputted or after the specific period of time lapses. The inputted data is transmitted from the input buffer 16 to the I/O control 14.

In the I/O control 14, write order of the write data is determined and/or a data mask processing etc. is performed, and the write data is transmitted to the column selector 12. In this case, the sense amplifier SA to which the data is written is selected by the column-selection signal outputted from the column selector 12, and the write data control performs a write operation to the memory cell MC in accordance with the data inputted to said sense amplifier SA.

The write data control 13 controls a voltage and a period to be applied to the bit line in the case (first information) of a change to a high-resistance state of the phase-change element and in the case (second information) of a change to a low-resistance thereof.

Then, when the pre-charge command is inputted, the word line is deactivated in the word driver 10 and the bit line in the memory cell array 17 is pre-charged and preparation for the next cycle is executed after waiting until the write operation in the write data control 13 is completed.

Next, each operation of the word driver 10, the memory cell array 17, and the column selector 12 will be described by using the timing chart in FIG. 8.

FIG. 8 shows, from top to down, each signal timing for: the clock signal CLK; the command CMD; the pre-charge signal RP outputted from the row decoder 9; the word line WL; a bit-line separation signal RTG; column-selection lines C01 and C23; the write-enable signals W01 and W23; an active standby pre-charge signal RP2; the sense-amplifier source node SAN; the bit lines BL1 to BL3; the output nodes SAOt0, SAOb0, SAOt1, and SAOb1; and the data input/output pin DQ. Also, in FIG. 8, only main array control signals are shown and other signals are omitted.

Firstly, an act command ACT synchronized with a clock signal CLK is inputted in combination with the command pins. In accordance with this, the pre-charge of the bit lines BL0, BL1, . . . is completed in the memory cell array 17.

Then, an address inputted together with the command is decoded by the row address decoder 9, and the corresponding word line WL is selected from a plurality of word lines by the word driver 10.

The bit lines BL0, BL1, ..., which have been pre-charged to a desired pre-charge level VR, are discharged by a current flowing depending on the magnitude of the resistance of the phase-change resistance PCR in the selected memory cell MC, so that the potential thereof is decreased.

At that time, if the resistance of the phase-change resistance PCR is at high level, i.e., if the phase-change element is in an amorphous state, the level of the bit line BL is not much decreased. Meanwhile, if the resistance of the phase-change resistance PCR is at low level, i.e., if the phase-change element is in a crystalline state, the level of the bit line BL is rapidly decreased.

The transistor of which the gate receives the bit-line separation signal RTG limits an amount of charges charged to the bit line BL on a side of the memory cell array 17 side, and configures a charge transfer amplifier. Thereby, even if a small signal exists in the bit line BL on a side of the memory cell array 17, a large amount of signals are generated in the bit line BL1 in the sense amplifier SA.

After the predetermined time lapses, the bit lines BL0, BL1, ... and the bit lines BLI0, BLI1, ... in the sense amplifier SA are separated by the bit-line separation signal RTG. Then, the sense amplifier SA is activated by driving the sense-amplifier source node SAN to the ground level VSS, and a small read-out signal is amplified up to an array operation voltage amplitude and outputted to the output nodes SAOt/b1.

Thereafter, the active standby pre-charge signal RP2 within the active period is changed to an activation level, and the bit lines BL0, BL1, ... are set to the same potential as that of the source line SL in the memory cell MC, e.g., to the ground level VSS in this case. The process as having been described thus far is a sequence performed before the column access is made.

Next, a write operation performed in the column access will be described. FIG. 8 shows the case where the column access is made, e.g., a write command WRIT is inputted.

After a predetermined period of time lapses from issuance of an act command, e.g., after a period tRCD in Figure elapses, the write command WRIT is inputted. The write data is inputted to the data input/output pin DQ concurrently with the command or after the predetermined clock.

This Figure is shown as an external input/output method, i.e., by a single data rate (SDR) method outputted in accordance with rising of an external clock signal CLK, but may be applied also to a double data rate (DDR) method outputted in accordance with both rising and falling of the external clock signal CLK.

The column-selection line, e.g., a column-selection line C01 is activated in accordance with the write address inputted concurrently with the command, and data is written in the sense-amplifier output node SAOt/b through the I/O line from the I/O control unit 14.

In Figure, "0" is written in each of the output nodes SAOt0 and SAOb1, and "1" is written in each of the output nodes SAOb0 and SAOt1. When the write operations are completed, the column-selection line C01 is changed to the deactivated state and new data is latched in the sense amplifier.

Then, corresponding to the column-selection signal, the write-enable signal W01 selected from the write-enable signals of W01 and W23, which are arranged in parallel with the column lines of C01, C23, ... is changed to the ground level VSS.

Thereby, in the write driver WD, the high-resistance voltage VWH is applied to the bit line BL1, and a current required for a change to a high-resistance state flows in the phase-change elements of the selected memory cell MC, so that heat is generated.

Meanwhile, in the write driver WD connected to the bit line BL0, the gate level of the selection transistor MPL is set to the ground level VSS by the inverters INV0 and INV1.

The write-enable signal W01 is activated only a period of time required for a change to a high-resistance state. Concurrently with being deactivated, the bit lines BL0 and BL1 are set to the bit line level VS that is at a standby level, so that in the memory cell executing a write operation for a change to a high-resistance state, the current is rapidly decreased due to the above operation and is cooled off to make a change to a high-resistance state. Further in FIG. 6, an operation for writing to the bit lines BL2 and BL3 is performed subsequently to the operation for writing to the bit lines BL0 and BL1.

The write operation to the memory cell connected to the bit lines BL2 and BL3 is the same as the case of the above-mentioned bit lines BL0 and BL1.

Next, the case where a write command to the same address is inputted through a continuous column cycle will be described.

At this time, there occurs the case where new data is written to the sense amplifier SA during writing to the memory cell MC. For this reason, either of the column address buffer 6 and the column address counter 8 determines whether the access has been made to the same address. If it has been made to the same address, the write-enable signal W send from the column decoder 11 to the data control 13 is deactivated to stop the write operation to the memory cell MC and the write operation to the sense amplifier is performed with new write data. Thereafter, the write operation to the cell is performed.

Thereby, the different pieces of data can be prevented from being written to the memory cell MC and concurrently the data, which are written to the sense amplifier, can be certainly written to the memory cell MC.

Next, an operation after the column operation is completed and the pre-charge command is inputted will be described.

When the pre-charge command PRE is inputted, the active standby pre-charge signal PR2 is deactivated. When the active standby pre-charge signal PR2 is changed to the ground level VSS, the gate of the transistor MPL is set to the ground level VSS in the write driver connected to the bit line BL1. Therefore, since the gate of the transistor MPL1 connected in series reaches the ground level, the voltage VWL required for a change to a low-resistance state is applied to the bit line BL1 and the current required for a change to a low-resistance state flows in the selected memory cell MC, whereby heat is generated.

Then, after a time required for a change to a low-resistance state lapses, the selected word line WL is deactivated and the current flowing into the memory cell is shut off, whereby the phase-change elements are cooled off and changed to a low-resistance state. Almost simultaneously with it, the sense amplifier SA is deactivated by a sense-amplifier activation signal SAN.

Finally, the pre-charge signal RP is activated and the bit line is set to the pre-charge level VR in the pre-charge circuit PC by the pre-charge signal RP. Simultaneously, the latch configured by the inverters INV0 and INV1 in the write driver WD is also initialized, and the gate of the transistor MPL is set to a high-potential state.

Thereby, the pre-charge operation is completed, and further a read operation, a change to a low-resistance state, and a change to a high-resistance state in a series of row cycle are completed.

Next, a read operation in the nonvolatile memory 1 will be described using the timing chart in FIG. 9.

In FIG. 9, only the main array control signal is shown and other signals will be omitted. Also, FIG. 9 shows, from top to down, each signal timing for: the clock signal CLK; the command CMD; the pre-charge signal RP; the word line WL; the bit-line separation signal RTG; the column-selection lines C01 and C23; the write-enable signals W01 and W23; the active standby pre-charge signal RP2; the sense-amplifier source node SAN; the bit lines BL1 to BL3; the output nodes SAOt0, SAOb0, SAOt1, and SAOb1; and the data output pin DQ.

A sequence made before the column access is as already described. The column signal C01 corresponding to the column address, which is inputted together with the read command, is selected and the data for the output nodes SAOt0/b0 and SAOt1/b1 are outputted to I/O lines IO0t/b and IO1t/b, respectively, and are transmitted to the outside.

Additionally, if an operation mode is a burst mode, a column signal C23 is selected so as to correspond to the continuous addresses and each of output nodes SAOt2/b2 and SAOt3/b3 is outputted to the I/O line.

Thereafter, the read-out data is outputted to the input/output pin DO through the I/O control 14 and the output buffer 15 after input of the read command and elapse of a predetermined period of a clock signal.

The Figure is shown as an input/output method of external data, i.e., by a single data rate (SDR) method outputted in accordance with the rising of an external clock signal, but may be applied to a double data rate (DDR) method outputted in accordance with the rising and the falling of the external clock signal.

Whether a write operation is performed or not in a series of column cycle, the pre-charge operation is the same.

Thus, the write data control 13 is provided with the latch for write and performs the operation for a change to a low-resistance state not per column cycle but after input of the pre-charge command, so that the high-speed column cycle operation can be achieved.

Meanwhile, the memory cell MC after a change to a high-resistance state does not perform a read operation immediately after the write operation, and does not perform the read operation until the word line is selected again after the pre-charge. Therefore, it is possible to obtain a sufficient cooling-off period of time and achieve the stable operation thereof.

Also, an operation in which the long time for write cycle is ensured will be described using the timing chart in FIG. 10. In the operation of FIG. 8, one-time piece of input/output data of the output pin DQ is simultaneously read from and written to the sense amplifier SA. In FIG. 10, plural-time pieces of input/output data of the output pin DQ are simultaneously read from the sense amplifier SA to the I/O control 14 and written from the I/O control 14 to the sense amplifier SA.

In this Figure, only the main array control signal is shown and other signals are omitted. Also, items of a signal change in FIG. 10 are omitted because they are the same as FIG. 8.

A sequence performed before the column access is as described above. A write operation by the column access will be described. In FIG. 9, when the write command WRIT is inputted into the bit line BL1 and the column access, the write data D0 is inputted into the data input/output pin DQ concurrently with the command or after the predetermined clock signal CLK.

The data at this time is held in the I/O control 14 until the next data D1 is inputted. FIG. 10 is shown as an external input/output method, i.e., by a single data rate (SDR) method outputted in accordance with the rising of the external clock signal CLK, but may be applied to a double data rate (DDR) method outputted in accordance with the rising and the falling of the external clock signal CLK.

The write data D1 is inputted subsequently to the write data D0. The column-selection line, e.g., the column-selection line C01 is activated in accordance with the address inputted concurrently with the command, and the data D0 and the data D1 are written through the I/O line from the I/O control 14 into the sense-amplifier output nodes SAOt0/t0 and SAOt1/t0, respectively.

In Figure, "0" is written to each of the output nodes SAOt0 and SAOb1, and "1" is written to each of the output nodes SAOb0 and SAOt1. When the write operations are completed, the column-selection line C01 is changed to the deactivated state and new data is latched in the sense amplifier SA.

Then, corresponding to the column-selection signal, the write-enable signal W01 selected from the write-enable signals of W01 and W23, which are arranged in parallel with the column lines of C01, C23, . . . is changed to the ground level VSS.

Thereby, in the write driver WD, the high-resistance voltage VWH is applied to the bit line BL1, and a current required for a change to a high-resistance state flows in the phase-change element of the selected memory cell, and heat is generated.

Meanwhile, in the write driver WD connected to the bit line BL0, the gate level of the transistor MPL is set to the ground level VSS by the inverters INV0 and INV1.

The write-enable signal W01 is activated only during a period of time required for a change to a high-resistance state. Concurrently with being deactivated, the bit lines BL0 and BL1 are set to a bit line level VS that is the standby level. In the memory cell executing the write operation for a change to a high-resistance state, a current is rapidly decreased due to the above operation, so that the memory cell is cooled down and changed to the high-resistance state.

Further in FIG. 10, the write operation to the bit lines BL2 and BL3 is performed subsequently to the write operation to the bit lines BL0 and BL1. The write operation to the memory cell connected to those bit lines is the same as the case of the above-described bit lines BL0 and BL1.

If the write command to the same address is inputted in the continuous column cycle, either of the column address buffer 6 and the column address counter 8 determines, similarly to the above-mentioned case, whether the access is made to the same address. If it is made to the same address, the write-enable signal W from the column decoder 11 to the write data control 13 is deactivated to stop the write operation to the memory cell MC. In parallel with it, the write operation to the sense amplifier SA is performed with new write data and then the write operation to the memory cell MC is performed.

Thereby, the different pieces of data can be prevented from being written to the memory cell MC and the data, which is written to the sense amplifier SA, can be certainly written to the memory cell MC.

Thus, an operation for the change to a low-resistance state, which relatively takes time for writing, is performed not per column cycle but after input of the pre-charge command, so that a high-speed column cycle operation can be achieved. Meanwhile, the memory cell MC after the change to a high-resistance state does not perform a read operation until the word line is selected again after the pre-charge, so that it is possible to obtain a sufficient cooling-off period and achieve the stable operation. The cycle time required for writing to the sense amplifier SA and the phase-change element can be ensured longer than the data input cycle, whereby the stable write operation can be achieved.

Further, there is the advantage that a time allocated for the change to a high-resistance state can be made longer and the reliable write operation can be achieved.

In the first embodiment, the write operation to the memory cell is performed by using, as a unit, the one-time piece of write data from the outside. However, for example, as shown by the timing chart in FIG. 11, the write operation to the memory cell may be performed by using the four-time pieces of write data therefrom as a unit.

In FIG. 11, each of the bit lines BL0 and BL2 performs the write operation from a high-resistance state to a low-resistance state. Also, there is illustrated an example in which each of the bit lines BL1 and BL3 performs the write operation from the low-resistance state to the high-resistance state. The detailed operations of them are the same as those of the first embodiment.

Thus, in order to perform the write operation to the memory cell MC by using the four-time pieces of write data as a unit, if the memory cell array 17 is preferably performed at four times as long as a cycle for writing the external data, the sufficient write time can be allotted to the change to a high-resistance state, whereby the stable write operation can be achieved.

Second Embodiment

Figure 12:
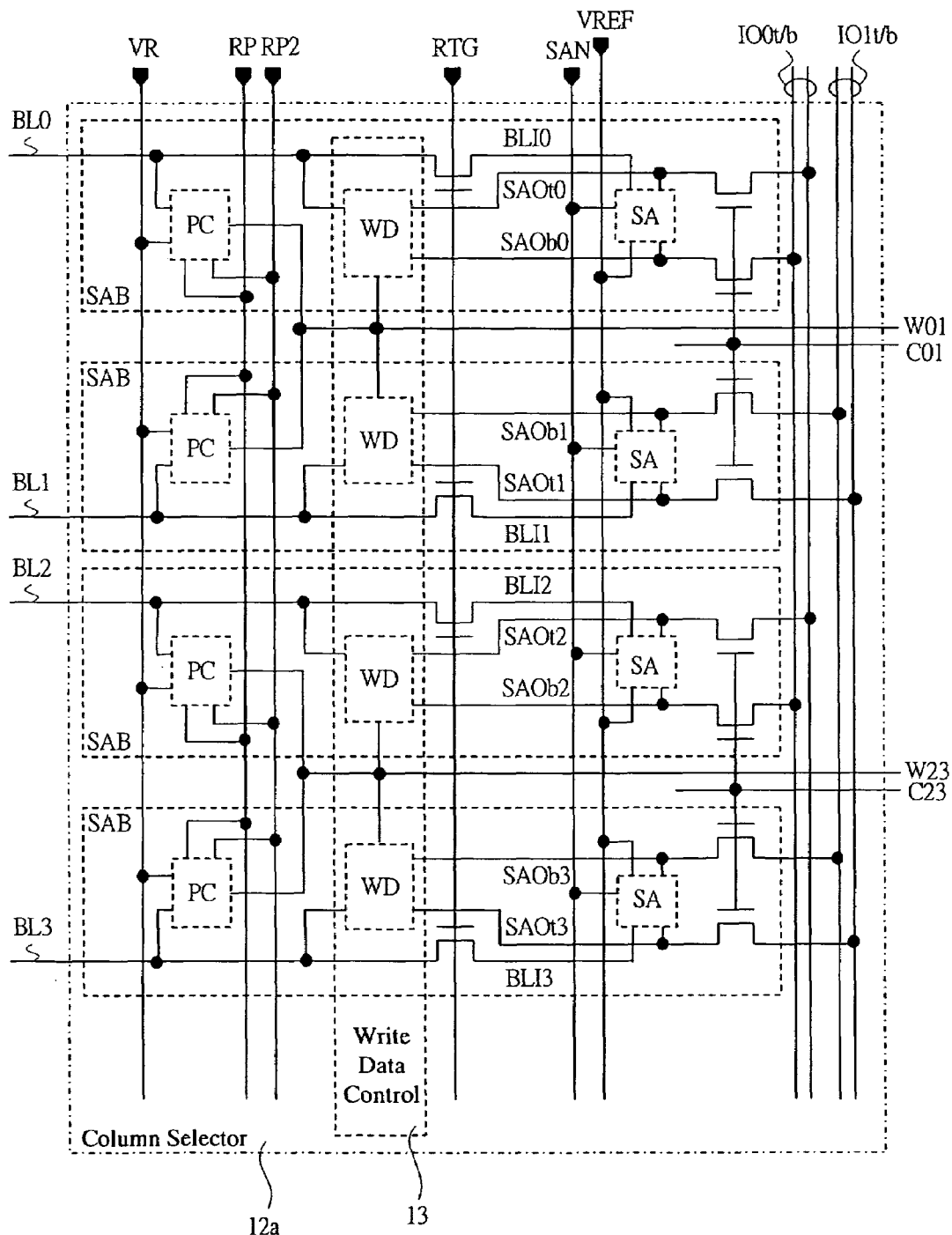
FIG. 12 is a circuit diagram of a column selector provided in a nonvolatile memory according to a second embodiment of the present invention.
Figure 14:
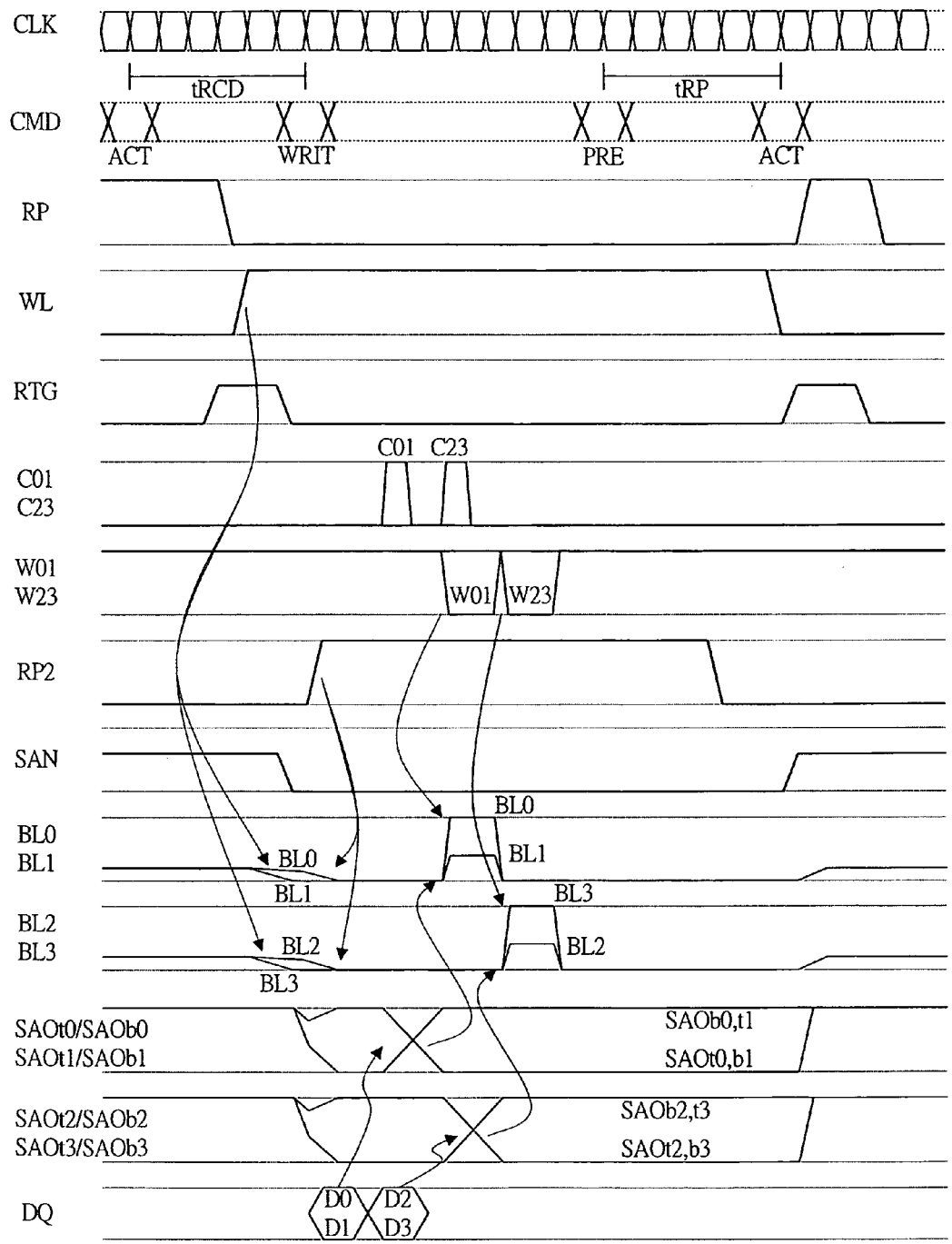
FIG. 14 is a timing chart showing one example of a write operation by a nonvolatile memory according to a second embodiment of the present invention.
Figure 15:
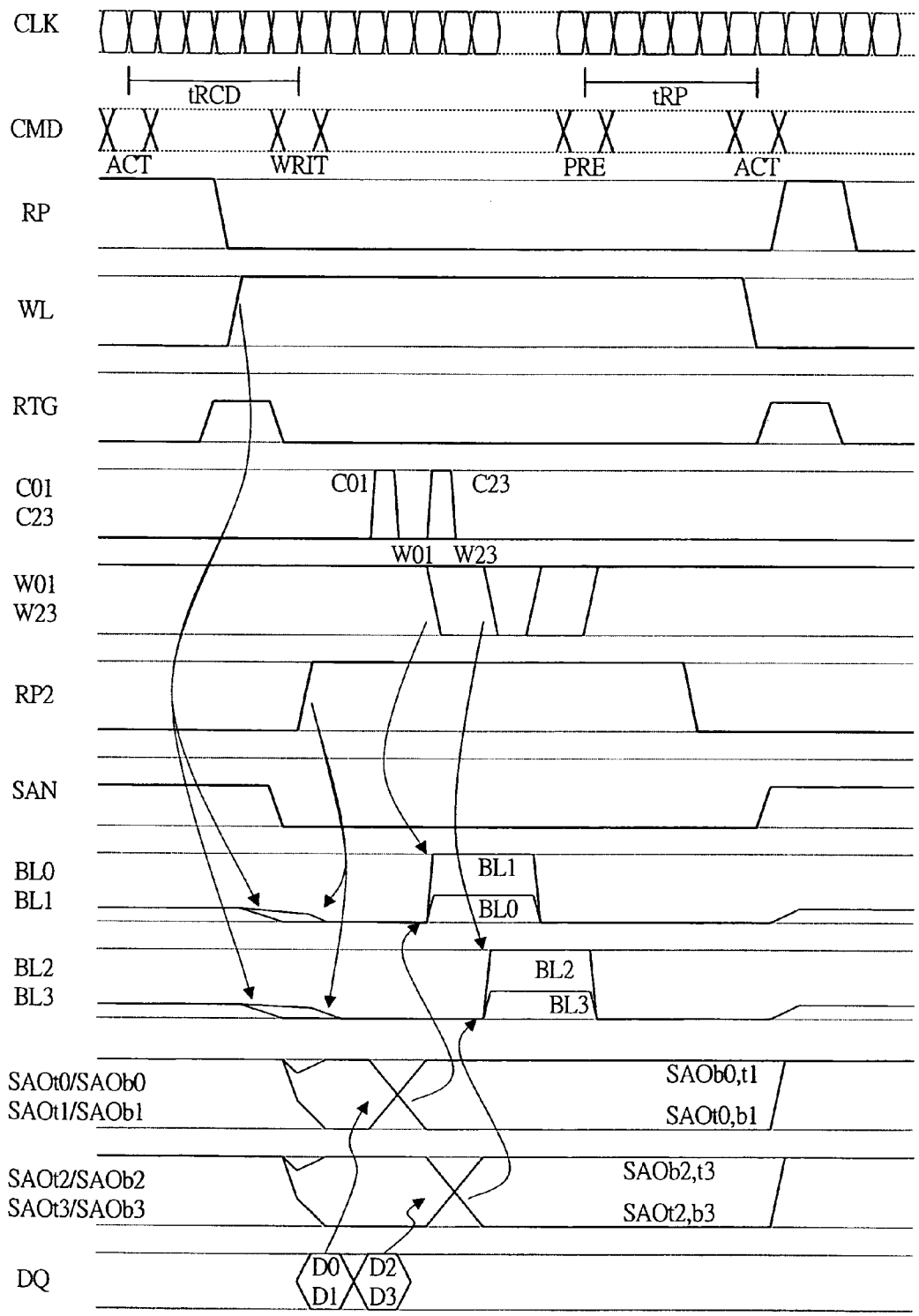
FIG. 15 is a timing chart showing another example of a write operation by a nonvolatile memory according to a second embodiment of the present invention.

FIG. 12 is a circuit diagram of a column selector provided in a nonvolatile memory according to a second embodiment of the present invention; FIG. 13 is a circuit diagram of a write driver provided in the column selector of FIG. 12; FIG. 14 is a timing chart showing one example of a write operation by a nonvolatile memory according to a second embodiment of the present invention; and FIG. 15 is a timing chart showing another example of a write operation by a nonvolatile memory according to a second embodiment of the present invention.

In the second embodiment, the nonvolatile memory has the same configuration as that of the above-described first embodiment, but is different therefrom in a circuit configuration of a column selector 12a.

FIG. 12 is a circuit diagram showing a portion of the column selector 12a.

A column selector 12a simultaneously performs processes for changes to low-resistance and high-resistance states per column cycle in the same period.

The column selector 12a is configured by the sense amplifier blocks SAB connected respectively to the bit line BL0, BL1, BL2, . . . , and the write data control 13 disposed across the respective sense amplifier blocks, and the like.

The sense amplifier block SAB comprises: the pre-charge circuit PC for setting the bit line to the desired level in a desired period of time; the write driver WD included in the write data control 13 and driving each of the bit lines BL0, . . . in order to write the data to the memory cell MC in accordance with the write data; and the sense amplifier SA for amplifying a small signal read from the memory cell. The sense amplifier SA and the pre-charge circuit PC may have the same configuration as that of the first embodiment.

Figure 13A:
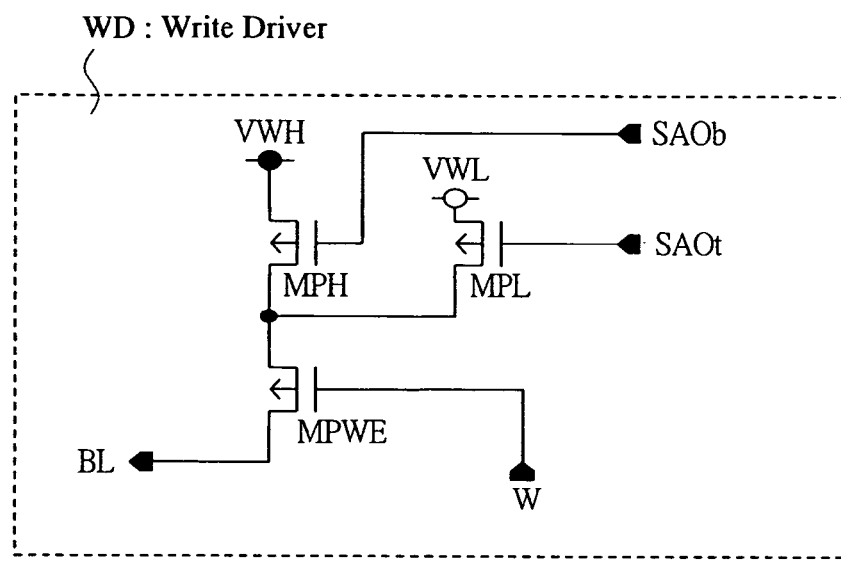
FIG. 13A and 13B are circuit diagram of a write driver provided in the column selector in FIG. 12.
Figure 13B:
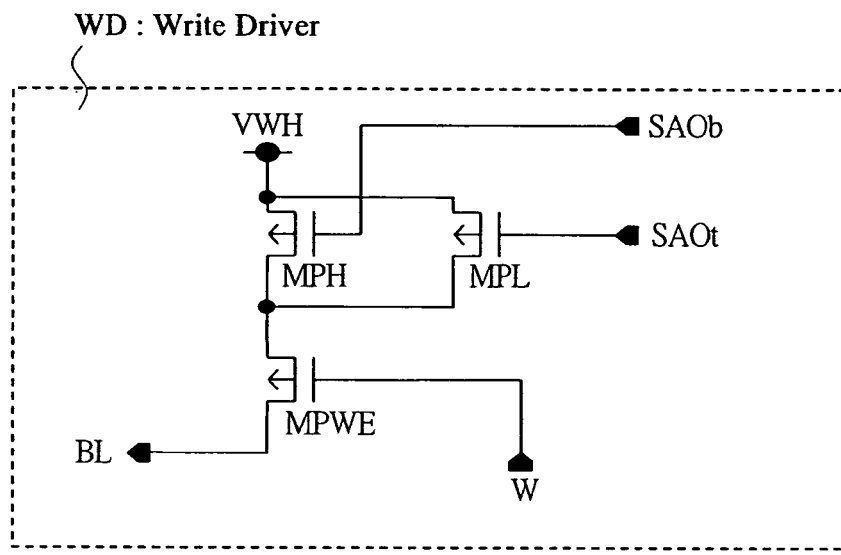

Also, FIGS. 13A and 13B are circuit diagrams showing configuration examples of the write driver.

In FIG. 13A, the P-channel MOS transistor MPH is turned on when the sense-amplifier output node SAOb is in a "0" state, and supplies, to the bit-line write transistor MPWE, the high-resistance voltage VWH required for carrying a current for the change to a high-resistance state.

Meanwhile, the P-channel MOS transistor MPL is turned on when the sense-amplifier output node SAOt is in a "0" state, and supplies, to the bit-line write transistor MPWE, a low-resistance voltage VWL required for carrying a current for the change to a low-resistance state.

The bit-line write transistor MPWE is activated by the write-enable signal W and applies a voltage to the bit line BL in accordance with the write data. A time for applying the voltage to the bit line BL is set depending on pulse width of the write-enable signal W and is set to the time required for the change to a high-resistance or low-resistance state.

Further, in FIG. 13B, the P-channel MOS transistor MPH is turned on when the sense-amplifier output node SAOb is in a "0" state, and supplies, to the bit-line write transistor MPWE, the high-resistance voltage VWH required for carrying a current for the change to a high-resistance state.

Meanwhile, the P-channel MOS transistor MPL is turned on when the sense-amplifier output node SAOt is in a "0" state, and supplies the high-resistance voltage VWL to the bit-line write transistor MPWE.

In this case, on-state resistance of the P-channel MOS transistor MPL is higher than that of the transistor MPH, and limited a current required for the change to a low-resistance state via the bit-line write transistor MPWE.

The bit-line write transistor MPWE is activated by the write-enable signal W, and applies a current to the bit line BL in accordance with the write data. A time for applying the current to the bit line BL is set depending on the pulse width of the write-enable signal W, and is set to the time required for both changes of high-resistance and low-resistance states.

The circuit configuration of the write driver WD is not limited to that of this embodiment, and if other different configurations have the same functions as those of the above configuration, they may be applied.

Next, a write operation of the column selector 12a will be described using the timing chart in FIG. 14. FIG. 14 shows the case where the write cycle is equal to or less than the column cycle time.

A sequence of the operations from input of the act command ACT to the column access is the same as the first embodiment. Also, a sequence of the operations from input of the write command WRIT by the column access to write of the sense-amplifier write data is the same as the first embodiment, so the description thereof will be omitted.

The FIG. 14 shows the cases where "0" is written into each of the sense-amplifier output nodes SAOt0 and SAOb1 and where "1" is written into each of the sense-amplifier output nodes SAOb0 and SAOt1.

In the next column cycle after new data is latched at the sense amplifier SA, the write-enable signal W01, which corresponds to the column-selection line having already been written among the write-enable signals W01, W23, . . . provided in parallel with the column-selection line C01, C23, . . . , is changed to the ground level VSS.

At this time, in the write driver WD connected to the bit line BL1, the high-resistance voltage VWH is applied to the bit-line write transistor MPWE by the transistor MPH. Additionally, the write-enable signal that is the gate signal of the bit-line write transistor MPWE becomes activated, so that the high-resistance voltage VWH is applied to the bit line BL1 and the current required for the change to a high-resistance state flows in the phase-change element of the selected memory cell MC and then heat is generated.

Meanwhile, in the write driver WD connected to the bit line BL0, the transistor MPL is activated and the low-resistance voltage VWL is applied to the bit-line write transistor MPWE. The write-enable signal that is the gate signal of the bit-line write transistor MPWE becomes activated, so that the low-resistance voltage VWL is applied to the bit line BL1 and the current required for the change to a low-resistance state flows in the phase-change element of the selection memory MC and then heat is generated.

Those write operations are performed for the period when the write-enable signal is activated. In FIG. 14, the write-enable signal is activated for the same period as that of the column cycle time. When the write-enable signal W becomes deactivated, the pre-charge circuit PC sets each of the bit lines BL0 and BL1 to the bit-line level VS in the standby level and the current decreases in the memory cell MC performing the write operation and the memory cell MC is cooled off.

Further in this Figure, the write operations to the bit lines BL2 and BL3 is performed subsequently to the write operations to the bit lines BL0 and BL1. Those write operations to the memory cell MC connected to the bit lines are the same as the case of the above-described bit lines BL0 and BL1.

In the above-mentioned configuration, when the write command to the same address is inputted in the continuous column cycle, addresses are compared similarly to the first embodiment and the write operation to the memory cell MC is stopped. Concurrently, new write data is written to the sense amplifier SA and thereafter the write operation to the memory cell MC is performed.

Next, an operation in the case where a time longer than the column cycle is required for the change to a low-resistance or high-resistance state will be described using the timing chart in FIG. 15.

A sequence of the operations from input of the act command ACT to execution of the column access and a sequence of the operations from input of the write command by the column access to write of the sense-amplifier write data is the same as the first embodiment and therefore the descriptions of them will be omitted.

The FIG. 15 shows the cases where the "0" is written into each of the sense-amplifier output nodes SAOt0 and SAOb1 and where the "1" is written into each of the sense-amplifier output nodes SAOb0 and SAOt1.

In the next column cycle after the new data is latched at the sense amplifier SA, the write-enable signal W01, which corresponds to the column-selection line having already been written among the write-enable signals W01, W23, ... provided in parallel with the column-selection line C01, C03, ... , is changed to the ground level VSS.

At this time, in the write driver WD connected to the bit line BL1, the high-resistance voltage VWH is applied to the bit-line write transistor MPWE by the transistor MPH. Further, the write-enable signal that is the gate signal of the bit-line write transistor MPWE becomes activated, so that the high-resistance voltage VWH is applied to the bit line BL1 and the current required for the change to a high-resistance state flows in the phase-change element of the selected memory cell MC and thereby heat is generated.

Meanwhile, in the write driver WD connected to the bit line BL0, the transistor MPL is activated and the low-resistance voltage VWL is applied to the bit-line write transistor MPWE. Further, the write-enable signal that is the gate signal of the bit-line write transistor MPWE becomes activated, so that the low-resistance voltage VWL is applied to the bit line BL1 and the current required for the change to a low-resistance state flows in the phase-change element of the selection memory MC and thereby heat is generated.

Those write operations are performed for the period when the write-enable signal W is activated. In FIG. 15, the write-enable signal is activated for a period of time longer than the column cycle time. When the write-enable signal W is deactivated, the bit lines BL0 and BL1 are set to the bit-line level VS in the standby level in the pre-charge circuit PC and, in the memory cell MC in which the write operation has been performed, the current decreases and thereby the memory cell MC is cooled off.

Further in FIG. 15, the write operations to the bit lines BL2 and BL3 are performed subsequently to the write operations to the bit lines BL0 and BL1. Those write operations to the memory cell MC connected to the bit lines are the same as those to the above-described bit lines BL0 and BL1.

When the write commands to the same address are inputted at the continuous column cycle, addresses are compared similarly to the first embodiment and the write operation to the memory cell MC is stopped. Concurrently, the new write data is written to the sense amplifier SA, and thereafter the write operation to the memory cell MC is performed.

Thus, since the write operations to the memory cell MC are per column cycle, the write operation in the raw cycle can be performed without a specific period of time.

Also, if the write operation to the sense amplifier SA and the write operation to the memory cell MC are performed at different timing, a time for performing the write operation to the memory cell MC does not limit the column cycle time. Therefore, the high-speed column cycle operation and the reliable write operation to the memory cell become compatible.

Further, the operation for reading out the data in the memory cell MC after the changes to low-resistance and high-resistance states corresponds to the case where the accesses to the same address again are made after the pre-charge. Therefore, the sufficient cooling-off period of time can be obtained.

Third Embodiment

Figure 16:
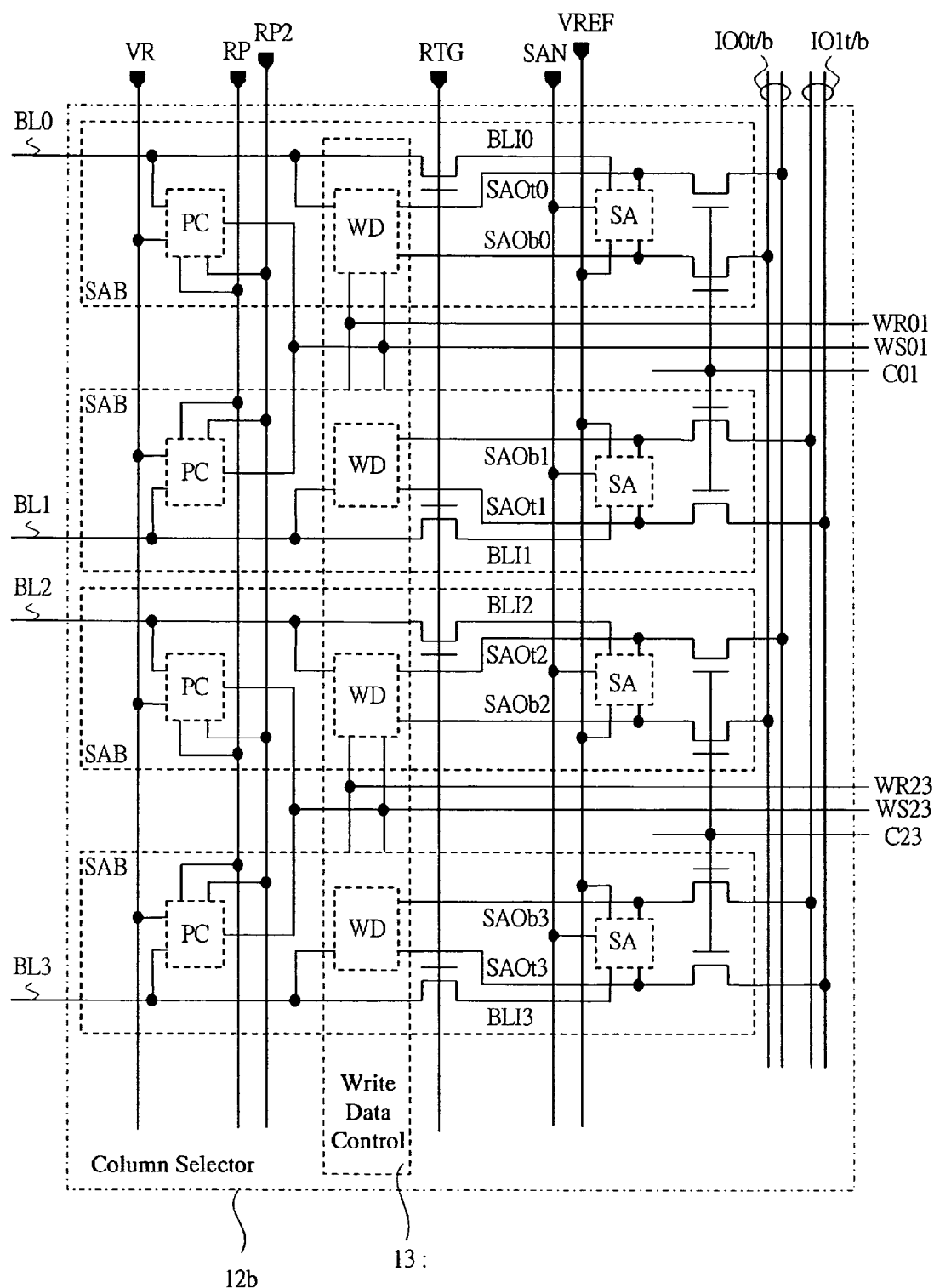
FIG. 16 is a circuit diagram of a column selector provided in a nonvolatile memory according to a third embodiment of the present invention.
Figure 18:
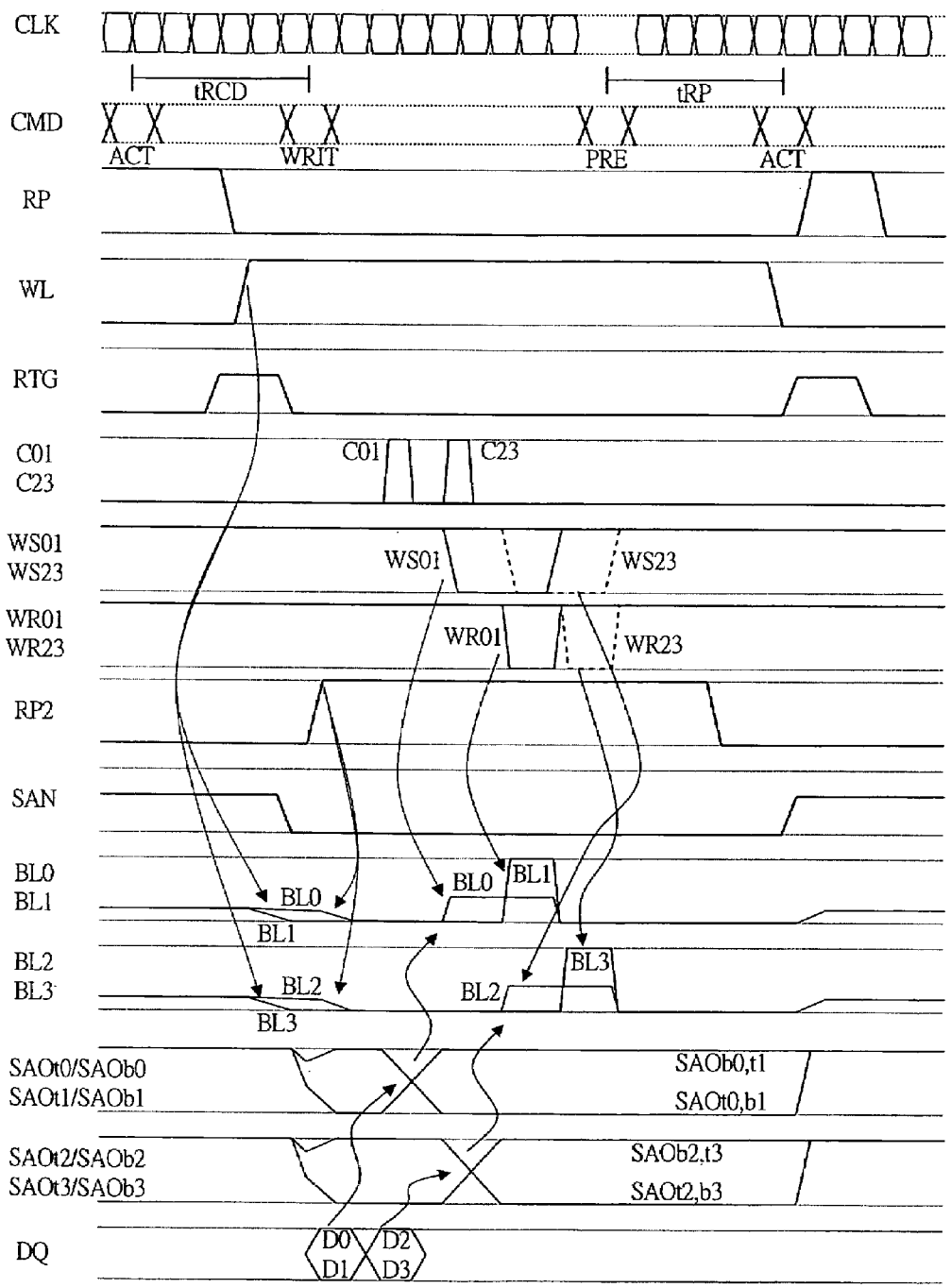
FIG. 18 is a timing chart showing one example of a write operation in a nonvolatile memory according to a third embodiment of the present invention.
Figure 19:
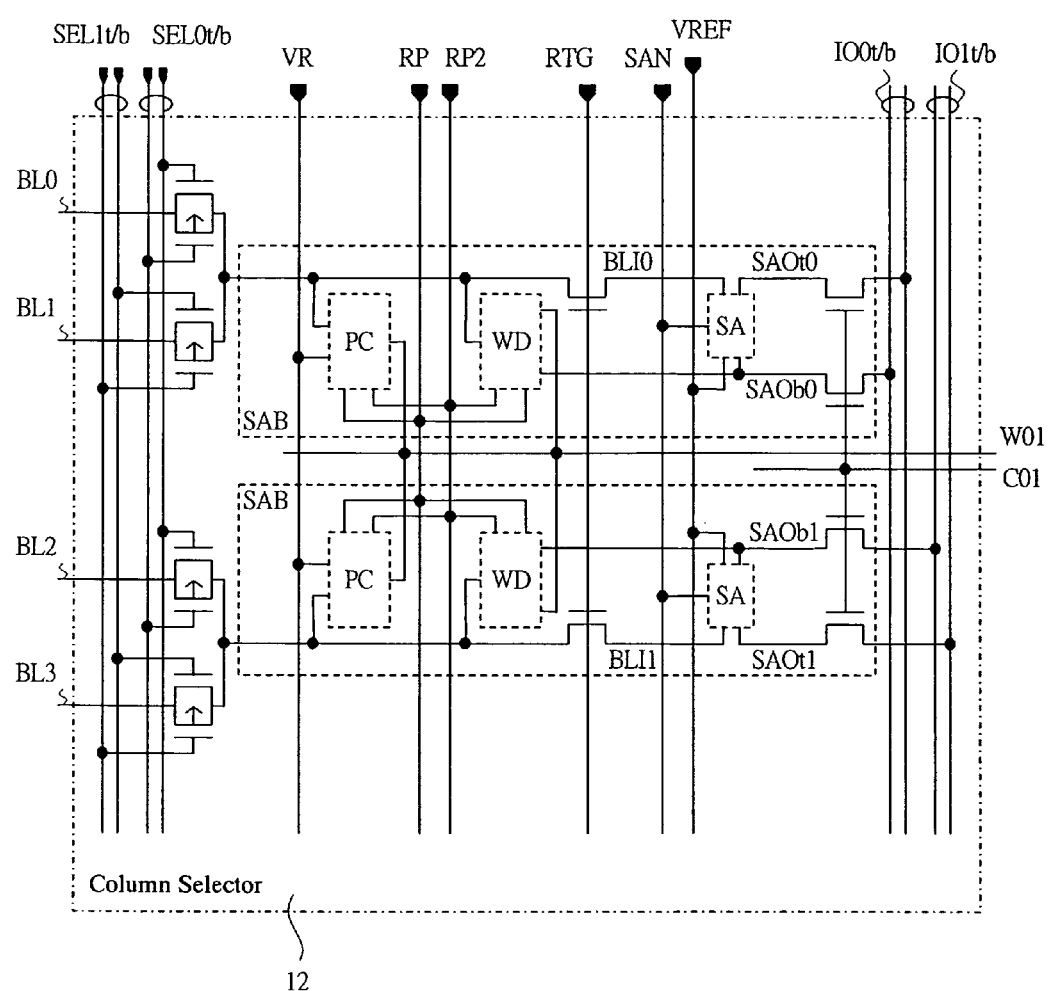
FIG. 19 is a circuit diagram showing another example of the column selector in FIG. 16.
Figure 20:
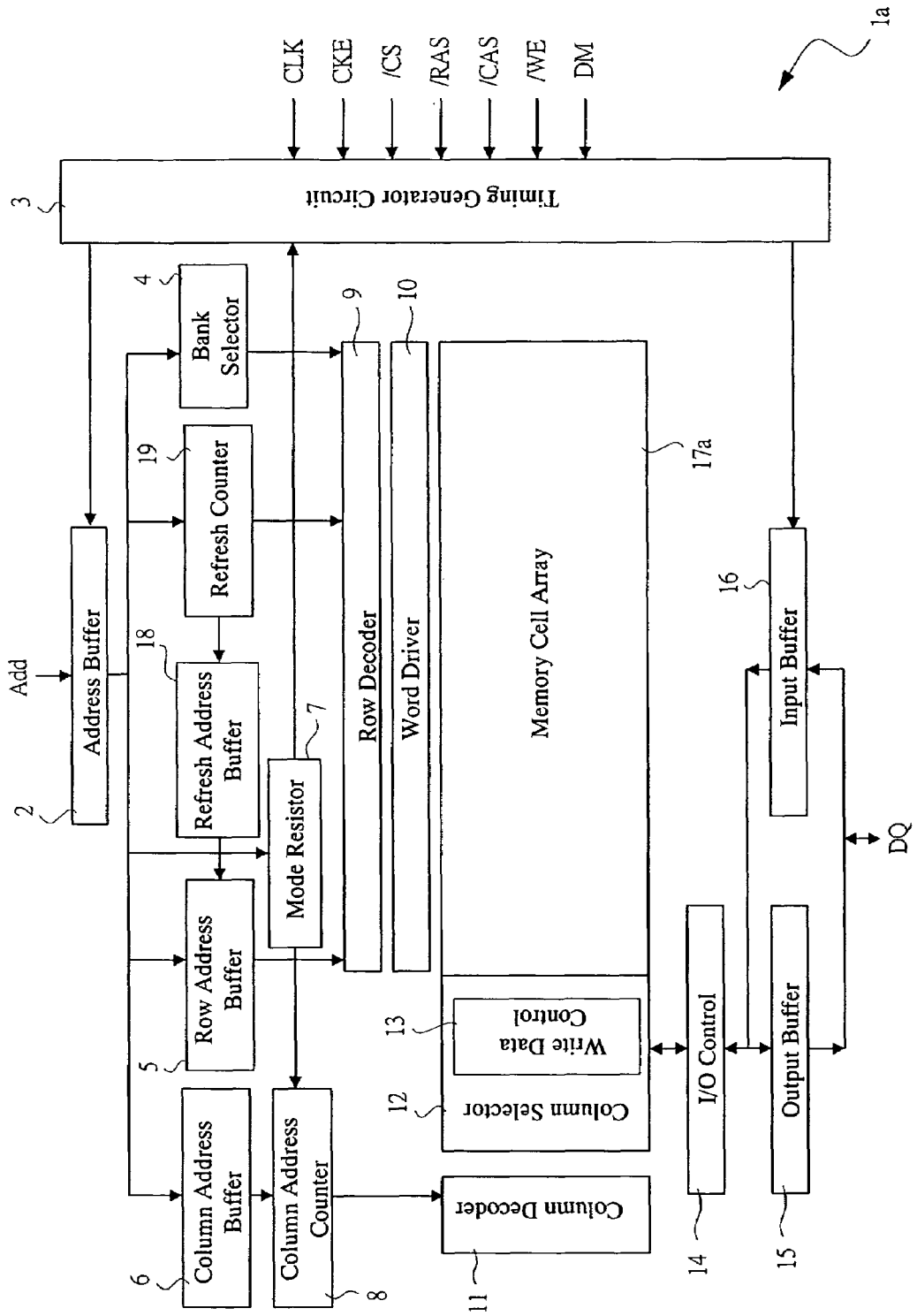
FIG. 20 is a block diagram showing one example of a nonvolatile memory having a refresh operation function, which is a third embodiment of the present invention.
Figure 21:
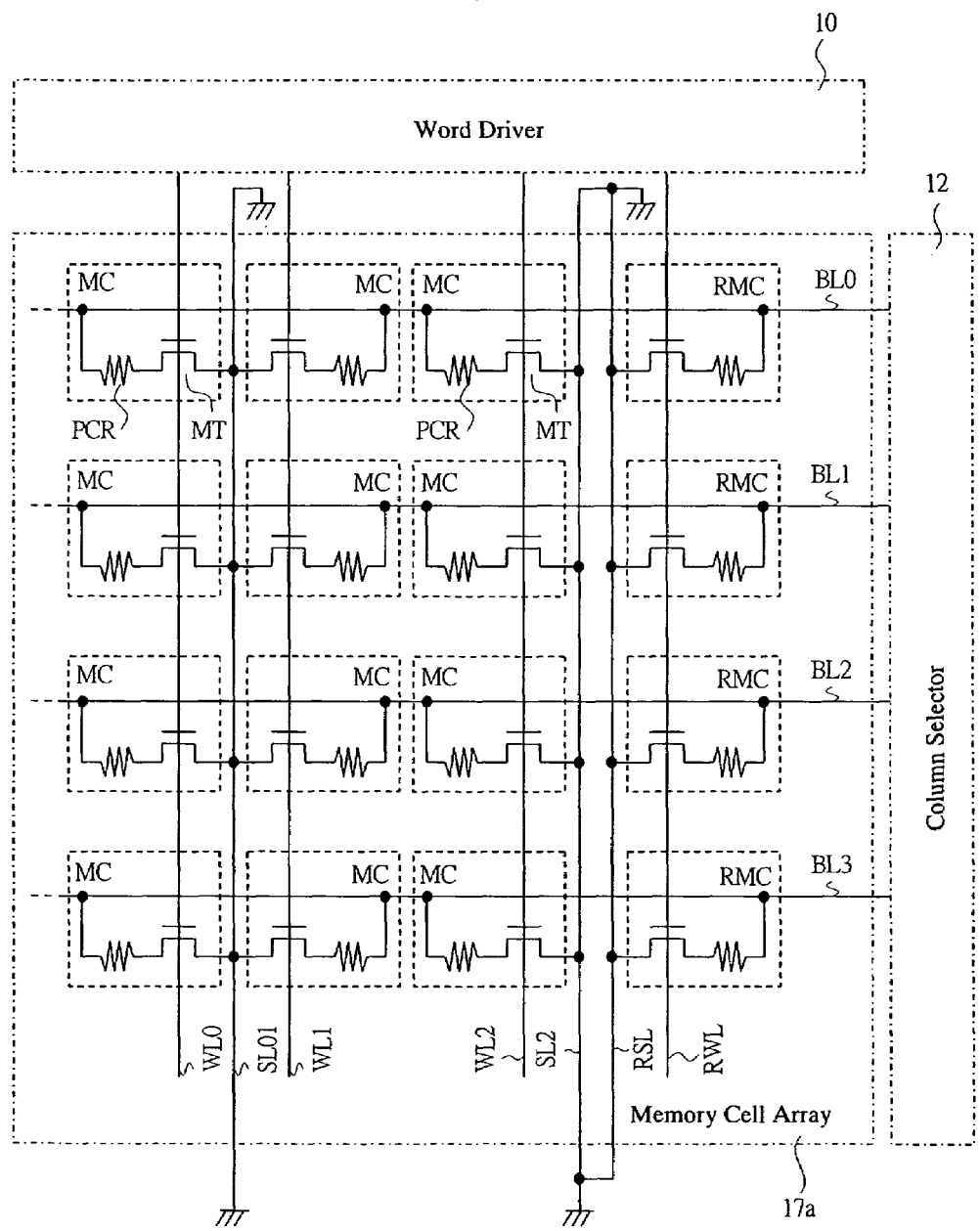
FIG. 21 is a block diagram showing one example of a memory cell in the nonvolatile memory in FIG. 20.
Figure 22:
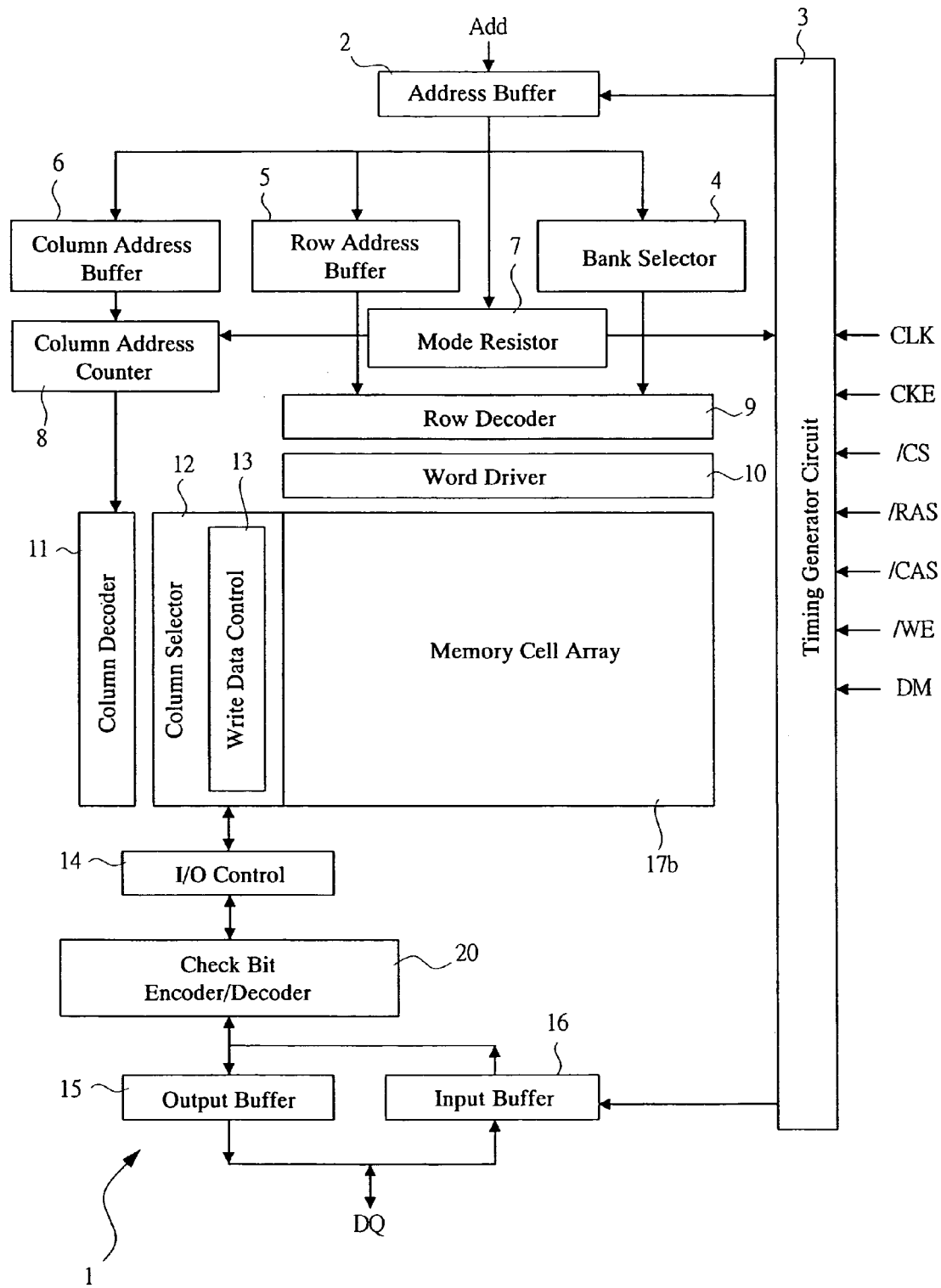
FIG. 22 is a block diagram showing one example of a nonvolatile memory having a data correction function, which is a third embodiment of the present invention.
Figure 23:
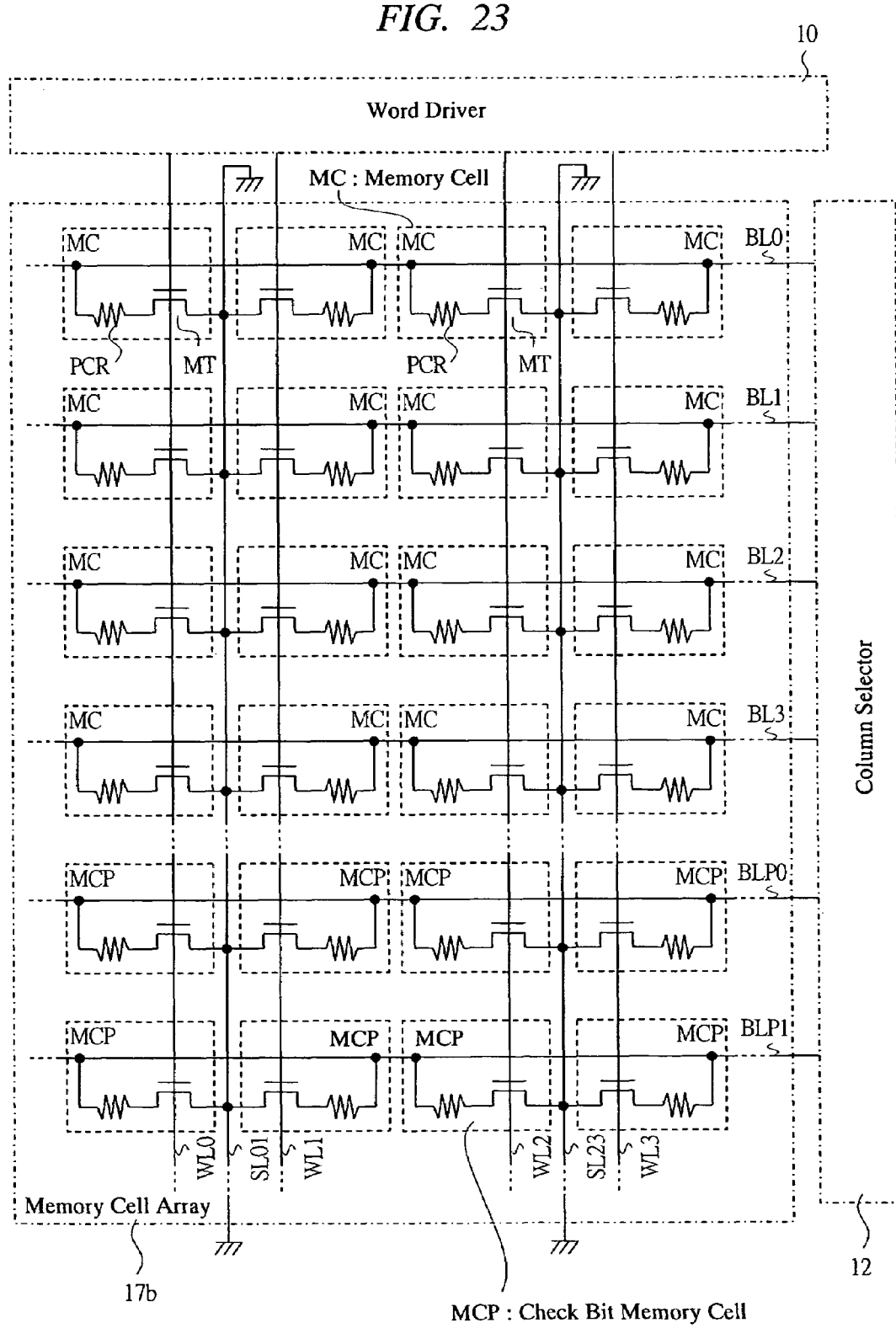
FIG. 23 is a circuit diagram showing one example of a memory cell array in the nonvolatile memory in FIG. 22.

FIG. 16 is a circuit diagram of a column selector provided in a nonvolatile memory according to a third embodiment of the present invention; FIG. 17 is a circuit diagram of a write driver provided in the column selector of FIG. 16; FIG. 18 is a timing chart showing one example of a write operation by a nonvolatile memory according to a third embodiment of the present invention; FIG. 19 is a circuit diagram showing another example of the column selector of FIG. 16; FIG. 20 is a block diagram showing one example of a nonvolatile memory having a refresh operation function, which is a third embodiment of the present invention; FIG. 21 is a circuit diagram showing one example of a memory cell in the nonvolatile memory in FIG. 20; FIG. 22 is a block diagram showing one example of a nonvolatile memory having a data correcting function, which is a third embodiment of the present invention; and FIG. 23 is a circuit diagram showing one example of a memory cell array in the nonvolatile memory in FIG. 22.

In a third embodiment, the nonvolatile memory has the same configuration as those of the first and second embodiments, but is different from the first and second embodiments in a circuit configuration of a column selector 12b.

FIG. 16 is a circuit diagram showing a portion of a column selector 12b.

The column selector 12b executes the changes to high-resistance and low-resistance states per column cycle for a period of time required for each change. The column selector 12b is configured by the sense amplifier blocks SAB connected respectively to the bit line BL0, BL1, BL2, . . . , and the write data control WDC disposed across the respective sense amplifier blocks SAB.

The sense amplifier block SAB comprises: the pre-charge circuit PC for setting each bit line to the desired level in the desired period of time; the write driver WD included in the write data control 13 and driving the bit lines BL0, . . . in order to write the data to the memory cell MC in accordance with the write data during a write time decided by the write-enable signal (first write signal) WR and the write-enable signal (second write signal) WS; and the sense amplifier SA for amplifying a small signal read from the memory cell MC. The sense amplifier SA and the pre-charge circuit PC may have the same configuration as those of the first and second embodiments.

Figure 17A:
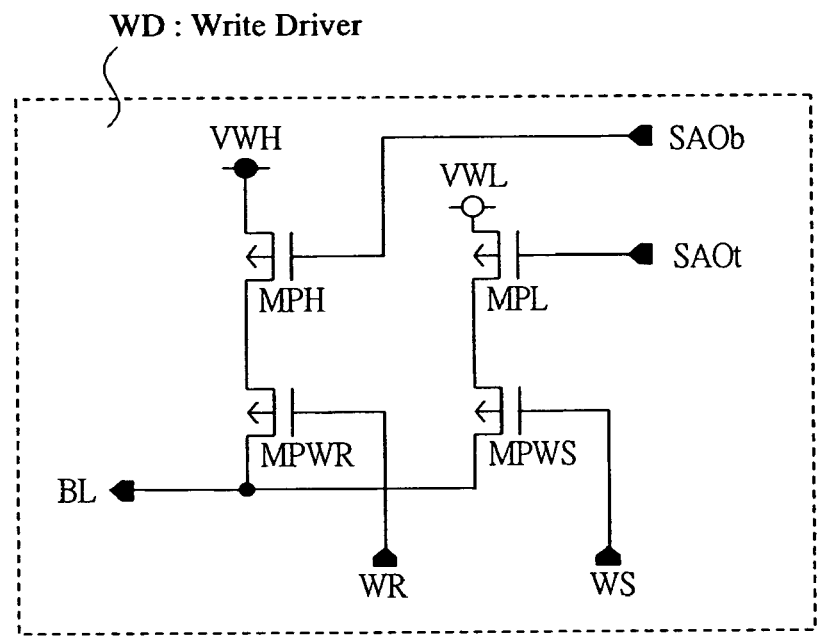
FIG. 17A and 17B are circuit diagram of a write driver provided in the column selector in FIG. 16.
Figure 17B:
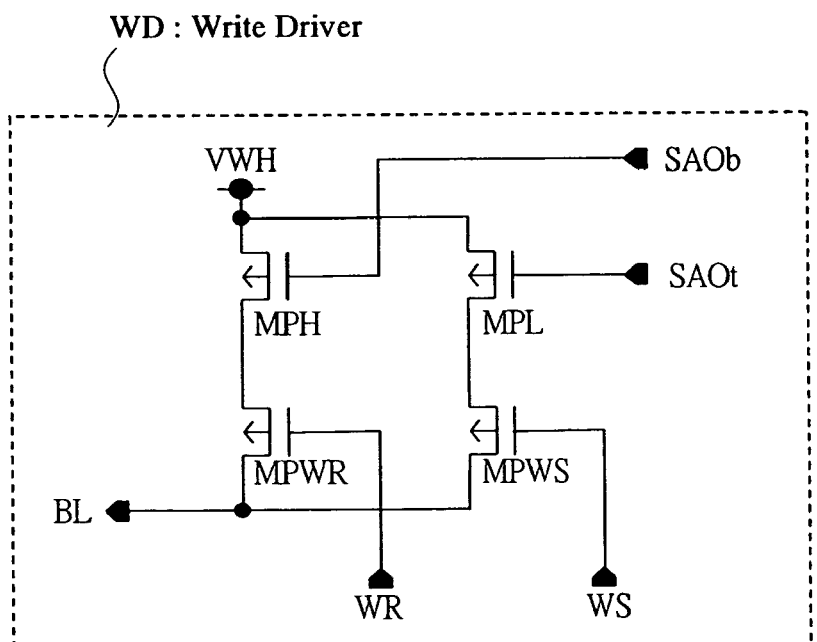

FIGS. 17A and 17B are circuit diagrams showing a configuration example of the write driver.

In FIG. 17A, the P-channel MOS transistor MPH is turned on when the sense-amplifier output node SAOb is in a "0" state, and supplies the high-resistance voltage VWH to a high-resistance write transistor MPWR.

Meanwhile, the P-channel MOS transistor MPL is turned on when the sense-amplifier output node SAOt is in a "0" state, and supplies the low-resistance voltage VWL to a low-resistance write transistor MPWS.

The high-resistance write transistor MPWR is controlled by a high-resistance write-enable signal WR and applies the high-resistance voltage VWH to the bit line BL while the high-resistance write-enable signal WP is activated.

The low-resistance write transistor MPWS is controlled by a low-resistance write-enable signal WS and applies the low-resistance voltage VWL to the bit line BL while the low-resistance write-enable signal WS is activated.

A time in which the voltage is being applied to the bit line is set depending on the pulse widths of the high-resistance write-enable signal WR and the low-resistance write-enable signal WS, and is set to the time required for the changes to high-resistance and low-resistance states.

Also, FIG. 17B is a modified example of FIG. 17A.

The P-channel MOS transistor MPH is turned on when the sense-amplifier output node SAOb is in a "0" state, and supplies the high-resistance voltage VWH to the high-resistance write transistor MPWR.

Meanwhile, the P-channel MOS transistor MPL is turned on when the sense-amplifier output node SAOt is in a "0" state, and supplies the high-resistance voltage VWH to low-resistance write transistor MPWS.

In this case, the on-state resistance of at least one of the transistor MPWR and transistor MPH is higher than that of the other. Thereby, the current flowing in the bit line is limited to a current required for the change to a low-resistance state. The high-resistance write transistor MPWR is controlled by the high-resistance write-enable signal WR and applies the high-resistance voltage VWH to the bit line BL while the high-resistance write-enable signal WR is activated.

The low-resistance write transistor MPWS is controlled by the low-resistance write-enable signal WS and applies, to the bit line BL, the current required for the change to a low-resistance state while the low-resistance write-enable signal WS is activated.

A time during which the voltage is being applied to the bit line BL is set depending on the respective pulse widths of the changes to high-resistance or low-resistance state, the high-resistance write-enable signal WR, or the low-resistance write-enable signal WS, and is set to the time required for the changes to high-resistance and low-resistance states.

The circuit configuration of the write driver WD is not limited to that of this embodiment. If other different circuit configurations have the same functions as that of the above configuration, they may be applied.

Next, a write operation in the column selector 12b will be described using the timing chart in FIG. 18.

FIG. 18 shows the case where a change to a high-resistance state is set to a column cycle time and a change to a low-resistance state is set twice as long as the column cycle time. A sequence of the operations from input of the act command ACT to execution of the column access is the same as that of the first embodiment.

Further, the operations from input of the write command WRIT by the column access to write of the sense-amplifier write data are the same as those of the first embodiment and therefore will be omitted.

The Figure shows the case where the "0" is written to each of the sense-amplifier output nodes SAOt0 and SAOb1 and the "1" is written to each of the sense-amplifier output nodes SAOb0 and SAOt1.

In the next column cycle after new data is latched at the sense amplifier SA, the write-enable signal W01, which corresponds to the column-selection line having already been written among the write-enable signals W01, W23, . . . provided in parallel with the column-selection lines C01, C23, . . . , is changed to the ground level VSS.

At this time, in the write driver WD connected to the bit line BL1, the high-resistance voltage VWH is applied to the high-resistance write transistor MPWR by the transistor MPH. Further, the high-resistance enable signal WR that is the gate signal of the high-resistance write transistor MPWR becomes activated, so that the high-resistance voltage VWH is applied to the bit line BL1 and the current required for the change to a high-resistance state flows in the phase-change element of the selected memory cell MC and thereby heat is generated.

The write operation for the change to a high-resistance state is performed during a period during which the high-resistance enable signal WR is activated. Meanwhile, in the write driver WD connected to the bit line BL0, the transistor MPL is activated and the low-resistance Voltage VWL is applied to the low-resistance write transistor MPWS.

Further, the low-resistance enable signal WS that is the gate signal of the low-resistance write transistor MPWS becomes activated, so that the low-resistance voltage VWL is applied to the bit line BL1 and the current required for the change to a low-resistance state flows in the phase-change element of the selected memory cell MC and thereby heat is generated. The write operation for the change to a low-resistance state is performed during a period during which the low-resistance enable signal WS is activated. In FIG. 18, the operation for the change to a high-resistance state is performed only for the same period of time as the column cycle time, and the operation for the change to a low-resistance state is performed during a period of double column cycle time.

In the above configuration, it is assumed as a write characteristic to the memory cell MC that the write time for the change to a low-resistance state is long. Therefore, when the low-resistance write-enable signal WS becomes deactivated, the bit lines BL0 and BL1 are each set to the bit level VS in the standby level in the pre-charge circuit PC and, in the memory cell MC performing the write operation, the current decreases and the memory cell MC is cooled off.

Further in FIG. 17, the write operations to the bit lines BL2 and BL3 are performed subsequently to the write operations to the bit lines BL0 and BL1. Those write operations to the memory cell MC connected to the bit lines are the same as the case of the above-described bit lines BL0 and BL1.

In this configuration, when the write commands to the same address are inputted in the continuous column cycle, addresses are compared similarly to the first embodiment and the write operation to the memory cell MC is stopped. Concurrently, the new write data is written to the sense amplifier SA and thereafter the write operation to the memory cell MC is performed.

Thus, the write operations for the changes to high-resistance and low-resistance states of the phase-change element are performed per column cycle, so that the write operation can be performed without a specific period of time in the raw cycle.

Also, the write operation to the sense amplifier SA and the write operation to the memory cell MC are performed at different timing, so that the time for performing the write operation to the memory cell MC does not limit the column cycle time and therefore the high-speed column cycle operation and the reliable write operation to the memory cell MC become compatible.

Further, the read-out operation of the data in the memory cell MC after the changes to low-resistance and high-resistance stats corresponds to the case where the pre-charge operation is once performed and then the same address is accessed again. Therefore, the sufficient cooling-off period of time can be obtained.

FIG. 19 is a circuit diagram showing another configuration example of the column selector 12.

In FIG. 19, one sense amplifier block SAB is disposed with respect to two bit lines, e.g., the bit lines BL0 and BL1.

The memory cell MC using the phase-change elements performs a nondestructive-read operation, so that it is unnecessary to write again the read-out data and also to dispose the sense amplifier SA and the write driver WD per bit line.

Therefore, two or more bit lines to which the simultaneously read memory cells MC are connected may share one sense amplifier block SAB. The respective configurations of the sense amplifier SAB, the pre-charge circuit PC, the write driver WD, and the sense amplifier SA are the same as those of the first and second embodiments.

For this reason, since the sense amplifier block SAB is shared by a plurality of bit lines, a layout area of the column selector can be reduced and thereby a small chip area can be implemented.

Further, this configuration may be combined with both of the above-described first and second embodiments. In that case, the area of the sense amplifier can be reduced and restrictions of layout pitches of the write driver WD and the sense amplifier SA can be eased. Therefore, it is possible to achieve the spatially ample layout and also to achieve such layout as to reduce variations of thresholds of the transistor and current-drivability.

In this case, the phase-change element stores information by changing the resistance value thereof. If the write operations are repeatedly performed, there is a possibility that variation of the resistance value will be made, i.e. write-resistance value will be varied. If a variation rate of the resistance value is changed and the high-resistance value is larger than the initially setting resistance value, the current required for the change to a low-resistance state cannot be carried and the write operation cannot be performed.

Inversely, if the high-resistance value is decreased, it becomes difficult to distinguish it from the low-resistance state and thereby there is a possibility that incorrect read will occur. Also, if the low-resistance value is larger than the initially setting resistance value, it is difficult to distinguish it from a high-resistance state and thereby there is a possibility that the incorrect read will occur.

Further, inversely with this, if the resistance value of the low-resistance state is decreased, heating value required for changing to a high-resistance state is not obtained and thereby the write operation can not be performed. Therefore, it is necessary to prevent the initial high-resistance and low-resistance values from being changed significantly.

FIG. 20 is a block diagram showing one example of a nonvolatile memory (semiconductor integrated circuit device) 1a having a phase-change-film refresh operation function for preventing a variation of the resistance value from being changed.

A nonvolatile memory 1a has the same configuration as that of the first embodiment, which is configured by: the address buffer 2; the timing generator circuit 3; the bank selector 4; the row address buffer 5; the column address buffer 6; the mode register 7; the column address counter 8; the row decoder 9; the word driver 10; the column decoder 11; the column selector 12; the write data control 13; the I/O (Input/Output) control 14; the output buffer 15; the input buffer 16; and the memory cell array 17a, and further includes a refresh address buffer 18, and a refresh counter 19.

The refresh address buffer 18 and the refresh counter 19 control addresses used in refreshing a phase-change film of the phase-change memory.

FIG. 21 shows a configuration example of the memory cell array 17a.

The memory cell array 17a includes a memory cell (first memory cell) MC for storing the data, and a refresh-data saving memory cell (second memory cell) RMC for temporary data storage during the refreshing. The memory cell MC may have the same configuration as that of the first embodiment or have such a configuration that the phase-change element and the selection transistor are replaced with each other.

Next, an operation when a refresh command in the nonvolatile memory 1a is inputted will be described.

The refresh command comprises command pins (/RAS, /CAS, /WE) and a specific input pattern to an address pin. Or, it may be controlled by a refresh-dedicated input pin.

When the refresh command is inputted, addresses to be refreshed in the refresh counter 19 are transmitted to the row decoder 9. Concurrently with this, the refreshed address is transmitted to the refresh address buffer 18.

The transmitted address is decoded in the row decoder 9, and the specific word line (first word line) WL is selected in the word driver 10. The information stored in the phase-change elements connected to the selected word line WL is read out by the sense amplifier.

In this case, the selected word line WL is deactivated. Meanwhile, the address of the word line for refresh-data saving (second ward line) RWL is transmitted to the row decoder 9 from the refresh counter 19, and the word line RWL for refresh-data saving is activated.

Thereafter, there is performed such an operation that the saved data in the sense amplifier block SAB (FIG. 4) is written to the memory cell RMC on the word line RWL for refresh-data saving. A writing method thereof may be the same as that of the first embodiment or be configured by other circuit configurations having the same functions.

After the write operation to the memory cell MC has been completed, the word line RWL for refresh-data saving is deactivated and the data retained in the refresh address buffer 18 is stored in the memory cell RMC for refresh-data saving.

The above-described procedure is a sequence in which the data to be refreshed in the memory cell MC is transferred to the memory cell for refresh-data saving.

Next, the case where an access is made to the refresh selection address while the data is transferred to the memory cell RMC for refresh-data saving will be described.

The address inputted from the outside is compared to the address stored always in the refresh address buffer 18 by an address comparator provided on the row address buffer 5. If the inputted address is not matched with the address stored in the refresh address buffer 18, the inputted address is activated.

Meanwhile, if the address stored in the refresh address buffer 18 is matched with the inputted address, the word line RWL for refresh-data saving, in which the data for the input address is saved, is selected and data read and write operations are performed.

Next, a sequence of a refresh operation will be described.

When the same refresh cycle or next refresh command is inputted, the address retained in the refresh address buffer 18 is transmitted to the row decoder 9. In the row decoder 9, the address to be refreshed is decoded and the corresponding word line WL is selected.

Then, a refresh operation to the phase-change element is performed. The refresh operation includes a change to a high-resistance or low-resistance state, or a repetition of changes to low-resistance and high-resistance states, which is performed by the write operation.

Thereby, a variation of the resistance values of the elements between the memory cell MC frequently accessed and the memory cell MC not accessed is reduced. In the case where the refresh operation of the film is completed, inversely with the above, the data is written back to the memory cell MC on the refreshed word line WL from the memory cell RMC for refresh-data saving.

This operation is the same as the above-described operation in which the data is transferred to the word line RWL for refresh-data saving from the word line WL to be refreshed. As soon as the data is transferred, the address stored in the refresh address buffer 18 is also initialized.

By the above-described configuration, i.e., by adding the memory cell RMC for refresh-data saving, the refresh address counter 18, and the refresh address buffer 19, the refresh operation is performed to the memory cell MC which has been rewritten several times. Therefore, it is possible to remove an influence on a history of accesses and improve a margin of operation. Also, it is possible to ease an influence on a change in characteristics of the film, which is caused by the repeated rewrite operations, and improve the data reliability.

Due to deterioration of the phase-change elements caused by writing to the specific bit, there is some fair of the fact that sufficient resistance values are not obtained. Therefore, it is necessary to prevent the data outputted from the outside from being destroyed even if any memory cell becomes defective.

FIG. 22 is a block diagram of a nonvolatile memory (semiconductor integrated circuit device) 1b having a data correcting function by adding an error correcting check bit.

The nonvolatile memory 1b has the same configuration as that of the first embodiment, which is configured by: the address buffer 2; the timing generator circuit 3; the bank selector 4; the row address buffer 5; the column address buffer 6; the mode register 7; the column address counter 8; the row decoder 9; the word driver 10; the column decoder 11; the column selector 12; the write data control 13; the I/O (Input/Output) control 14; the output buffer 15; the input buffer 16; and the memory cell array 17b, and further includes a check bit encoder/decoder 20.

The check bit encoder/decoder 20 is connected between the column selector 12 and the I/O control 14. The check bit encoder/decoder 20 generates check-bit data and detect an error bit of the read data.

FIG. 23 shows a configuration of the memory cell array 17b.

The memory cell array 17b as shown in the Figure has such a configuration that the memory cells MC for data and the memory cells MPC for check bit are added onto the word line WL. The memory cells MC are connected to respective desired intersections between the word lines WL1, WL2, WL3, . . . and the bit lines (first lines) BL0, BL1, BL2, BL3, . . . . The memory cells MCP for check bit are connected to respective desired intersections between the word lines WL1, WL2, WL3, . . . and the bit lines (second lines) BLP0, BLP1, BLP2, BLP3, . . . .

The number of check bits is determined by the number of bits included in an ECC (Error Correcting Code) block. For example, if the number of data bits is 64, at least 7 bits are required to correct 1 bit, and 8 bits are required to correct 1 bit or to detect the error of 2 bits.

Next, an operation will be described by using FIGS. 22 and 23.

An internal operation is determined in combination with the address and the signal inputted to the command input pin. Normally, in a SDRAM interface, addresses are divided into a row address and a column address and then are inputted.

At first, an activate command is inputted together with a bank address and the row address. The bank address is transmitted to the bank selector 4 and activates a specific bank in the chip.

The simultaneously inputted address is transmitted from the address buffer 2 to the row buffer 5 and the row decoder 9, and generates a selection signal for selecting a specific word line. Then, the word line corresponding to the inputted address is selected in the word driver 10. When the word line is selected, the data in the memory cell MC is read to the sense amplifier in the column selector 12.

After a spec-specified period of time lapses since the row address is inputted, the column address together with a command such as read or write is inputted into the address buffer 2. The inputted address is transmitted from the address buffer 2 to the column address buffer 6, and the column-selection line for selecting the sense amplifier having the specific address is outputted from the column decoder 11.

In the column operations, there are sometimes performed plural-time data inputs/outputs with respect to one-time address input. Therefore, in the column address counter 8, addresses are sequentially generated in order specified by the mode resistor 7 from the initial input address, and the generated addresses are transmitted to the column decoder 11.

When the column address together with a read command is inputted, the data for the sense amplifier having the address selected by the column-selection line outputted from the column decoder 11 is transmitted together with the data bit and the check bit from the column selector 12 to the check bit encoder/decoder 20. In this case, the check bit encoder/decoder 20 detects and corrects some errors in a data bit string by using the data bits and the check bits which are read from the memory cell array 17 and transmitted from the column selector 12.

The corrected data string is transmitted to the I/O control 14. In this case, the output data is selected and the selected data is outputted from the output buffer 15 to the input/output pin DQ.

When the column address together with the write command is inputted, the data is inputted into the input/output pin DQ concurrently with the command and the address or after an elapse of a specific period of time. The inputted data is transmitted to the I/O control 14 from the input buffer 16. The I/O control 14 determines write order for writing the data and performs a data mask process, etc., and transmits the write data spring to the check bit encoder/decoder 20.

The check bit encoder/decoder 20 generates new check bits by using the data written in the address, at which the corresponding write is performed, and the write data. The generated check bits and the data bits spring to be written are transmitted to the column selector 12.

In this case, the sense amplifier to which the data is written is selected by the column-selection signal outputted from the column selector 12. The write control 13 performs the write operation to the memory cell MC in accordance with the data written in the sense amplifier.

The data control 13 controls the voltage applied to the bit line and the period of time for applying the voltage thereto in each case of the changes to high-resistance and low-resistance states of the phase-change element.

Next, when the pre-charge command is inputted, the write operation in the write data control 13 is completed. After waiting for its completion, in the write driver WD (FIG. 4) the word line is deactivated and the bit lines in the memory cell array 17 are pre-charged, whereby the next cycle is prepared.

Thus, by adding the check bits as well as the data bits, the data error correcting function can be added. Accordingly, even if the resistant value of any memory cell MC including the check bits becomes defective in operating due to any kind of influence, the destruction of the external output data can be prevented.

Each of the circuit configurations described in the third embodiment is one example, and other circuit configurations may be applied as long as they have the same effects as those of the above embodiment. For example, if the P-channel MOS transistor of the write driver WD is replaced with the N-channel MOS transistor and the power level is set to the optimum value, the same effects can be obtained. In this case, since the current drivability of the write driver configured by the N-channel MOS is larger than that of the P-channel MOS, there is the advantage of being able to reduce the layout area of the write driver.

As described above, the invention made by the inventors has been specifically described based on the embodiments. However, needless to say, the present invention is not limited to the above-mentioned embodiments and can be variously modified and altered without departing from the gist thereof.

What is claimed is:

1. A semiconductor integrated circuit device comprising:
   a plurality of word lines;
   a plurality of bit lines crossing the plurality of word lines;
   a plurality of memory cells disposed at predetermined crossings between the plurality of word lines and the plurality of bit lines;
   a plurality of sense amplifiers connected to the plurality of bit lines; and
   a plurality of write drivers connected to the plurality of sense amplifiers and each including a first write switch writing first information to corresponding memory cells and a second write switch writing second information to the corresponding memory cells,
   wherein the first write switches of write drivers which are connected to sense amplifiers holding the first information are activated after four data are inputted to a data input buffer, and
   wherein the second write switches of write drivers which are connected to sense amplifiers holding the second information are activated after activating the first write switches to write the first information before starting a pre-charge operation.

2. The semiconductor integrated circuit device according to claim 1,
   wherein the first switches are activated in response to activation of a write enable signal,
   wherein the second switches are activated in response to inactivation of an active standby pre-charge signal,
   wherein the write enable signal is activated in response to input of a write command, and
   wherein the active standby pre-charge signal is inactivated in response to input of a pre-charge command.

3. The semiconductor integrated circuit device according to claim 1,
   wherein each said sense amplifier includes:
   a first data retaining circuit holding data for the corresponding memory cells or write data from outside; and
   a second data retaining circuit holding a write selection history.

4. The semiconductor integrated device according to claim 1,
   wherein a period during which the first write switches are activated is shorter than a period during which the second write switches are activated.

5. The semiconductor integrated device according to claim 1,
   wherein the plurality of memory cells are non-volatile memory cells.

6. The semiconductor integrated device according to claim 1,
   wherein each memory cell includes a phase-change resistance which changes a resistance value by application of a current.

* * * * *